US012777858B2

(12) United States Patent
Takahashi et al.

(10) Patent No.: US 12,777,858 B2
(45) **Date of Patent: *Oct. 27, 2026**

(54) SUBSTRATE PROCESSING METHOD AND SUBSTRATE PROCESSING APPARATUS

(71) Applicant: Tokyo Electron Limited, Tokyo (JP)

(72) Inventors: Motoi Takahashi, Miyagi (JP); Ryutaro Suda, Miyagi (JP); Maju Tomura, Miyagi (JP); Takatoshi Orui, Hillsboro, OR (US); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 766 days.

This patent is subject to a terminal disclaimer.

(21) Appl. No.: 18/121,621

(22) Filed: Mar. 15, 2023

(65) Prior Publication Data

US 2023/0223249 A1 Jul. 13, 2023

Related U.S. Application Data

(63) Continuation-in-part of application No. PCT/JP2021/017485, filed on May 7, 2021.

(51) Int. Cl.

| | |
|---|---|
| ***H10P 50/26*** | (2026.01) |
| ***C23C 16/34*** | (2006.01) |
| ***H10P 50/00*** | (2026.01) |
| ***H10P 50/24*** | (2026.01) |
| ***H10P 50/28*** | (2026.01) |

(52) U.S. Cl.

CPC .......... *H10P 50/268* (2026.01); *C23C 16/345* (2013.01); *H10P 50/242* (2026.01); *H10P 50/283* (2026.01); *H10P 50/73* (2026.01)

(58) Field of Classification Search

None

See application file for complete search history.

(56) References Cited

U.S. PATENT DOCUMENTS 12,400,835 B2 * 8/2025 Ohuchida ......... H01J 37/32449
2018/0204728 A1 * 7/2018 Oomori ................ H10P 50/242

(Continued)

FOREIGN PATENT DOCUMENTS

JP 11-354505 A 12/1999
JP 2017-50529 A 3/2017

(Continued)

OTHER PUBLICATIONS

International Search Report and Written Opinion mailed on Jul. 6, 2021, received for PCT Application PCT/JP2021/017485, filed on May 7, 2021, 11 pages including English Translation.

*Primary Examiner* — Duy Vu N Deo
*Assistant Examiner* — Andrew Keelan Laobak
(74) *Attorney, Agent, or Firm* — XSENSUS LLP

(57) ABSTRACT

A substrate processing method includes providing a substrate with a silicon-containing film in a chamber, supplying a process gas containing an HF gas, a phosphorus halide gas, and at least one gas selected from the group consisting of a $C_4H_2F_6$ gas, a $C_4H_2F_8$ gas, a $C_3H_2F_4$ gas, and a $C_3H_2F_6$ gas into the chamber to generate plasma, and etching the silicon-containing film in the substrate.

26 Claims, 13 Drawing Sheets

(56) References Cited

U.S. PATENT DOCUMENTS

| | | | | |
|---|---|---|---|---|
| 2021/0082709 | A1* | 3/2021 | Tomura | H10P 50/242 |
| 2021/0104382 | A1* | 4/2021 | Kim | H01J 37/32183 |

FOREIGN PATENT DOCUMENTS

| | | | | |
|---|---|---|---|---|
| JP | 2020-136584 | A | 8/2020 | |
| JP | 2020-533809 | A | 11/2020 | |
| WO | WO-2019108844 | A1 * | 6/2019 | H01L 21/31116 |
| WO | 2019/235398 | A1 | 12/2019 | |
| WO | 2020/090451 | A1 | 5/2020 | |

* cited by examiner

| No. | 1 | 2 | 3 | 4 |
| --- | --- | --- | --- | --- |
| Process Gas | A | B | A | B |
| Voltage to Upper Electrode | Yes | Yes | No | No |
| Mask Feature |  |  |  |  |

SUBSTRATE PROCESSING METHOD AND SUBSTRATE PROCESSING APPARATUS

CROSS-REFERENCE TO RELATED APPLICATIONS

The present application is a bypass continuation-in-part application of International Application No. PCT/JP2021/017485, filed May 7, 2021, which contains subject matter related to, U.S. Ser. No. 17/666,570, entitled: ETCHING METHOD, filed on Feb. 8, 2022 and U.S. Ser. No. 17/092,376, entitled: SUBSTRATE PROCESSING METHOD AND SUBSTRATE PROCESSING APPARATUS, filed on Nov. 9, 2020, the entire contents of which are incorporated herein by reference.

FIELD

Exemplary embodiments of the present disclosure relate to a substrate processing method and a substrate processing apparatus.

BACKGROUND

For example, Patent Literature 1 describes a technique for etching a silicon oxide film.

CITATION LIST

Patent Literature

Patent Literature 1: Japanese Unexamined Patent Application Publication No. 2016-122774

BRIEF SUMMARY

Technical Problem

One or more aspects of the present disclosure are directed to a technique for improving the etching rate.

Solution to Problem

A substrate processing method according to one exemplary embodiment of the present disclosure includes providing a substrate with a silicon-containing film in a chamber, supplying a process gas containing an HF gas, a phosphorus halide gas, and at least one gas selected from the group consisting of a $C_4H_2F_6$ gas, a $C_4H_2Fe$ gas, a $C_3H_2F_4$ gas, and a $C_3H_2F_6$ gas into the chamber to generate plasma, and etching the silicon-containing film in the substrate.

Advantageous Effects

The technique according to one exemplary embodiment of the present disclosure improves the etching rate.

DETAILED DESCRIPTION

Figure 1:
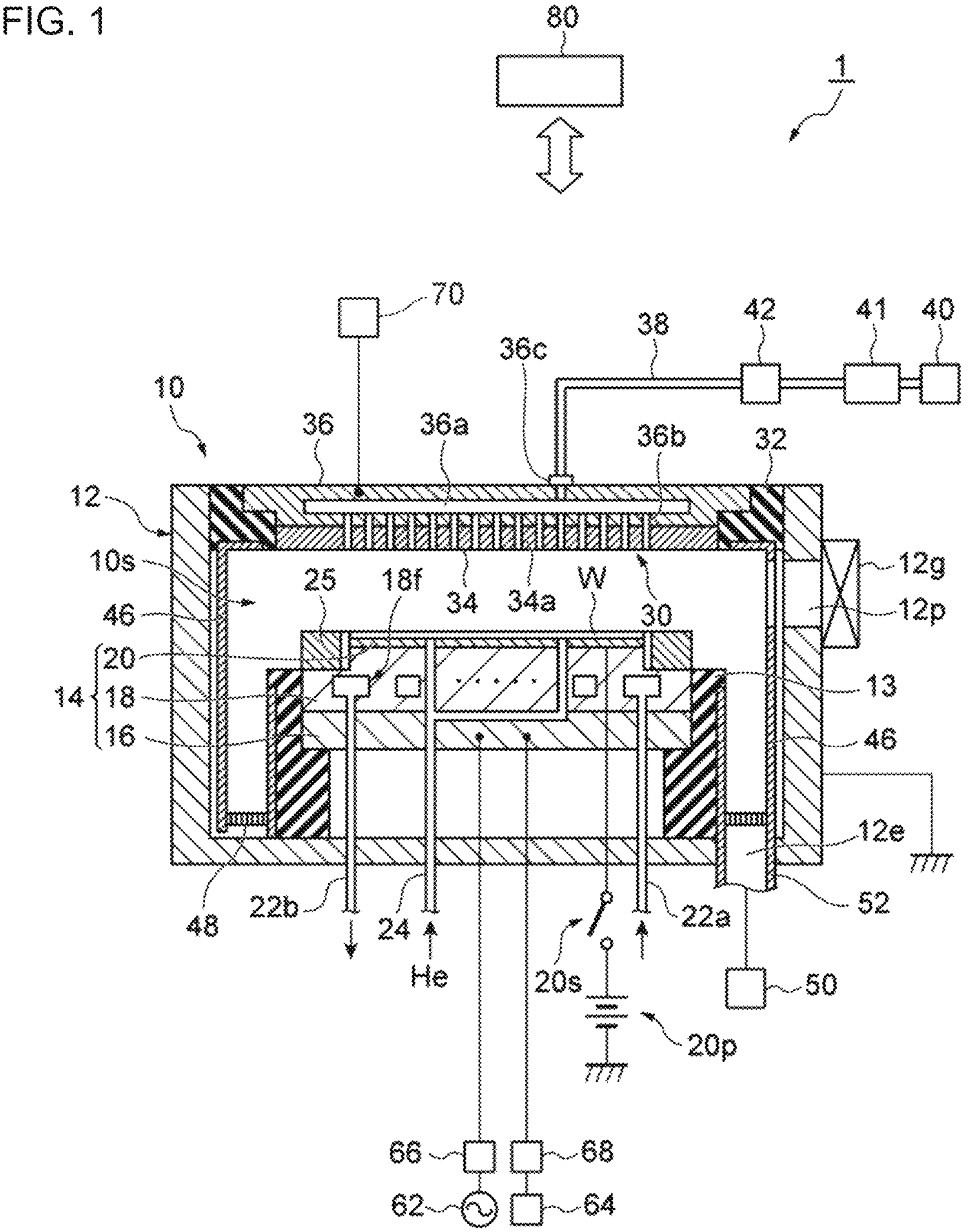
FIG. 1 is a schematic diagram of a substrate processing apparatus 1.

One or more embodiments of the present disclosure will be described below.

A substrate processing method according to one exemplary embodiment includes providing a substrate with a silicon-containing film in a chamber, supplying a process gas containing an HF gas, a phosphorus halide gas, and at least one gas selected from the group consisting of a $C_4H_2F_6$ gas, a $C_4H_2Fe$ gas, a $C_3H_2F_4$ gas, and a $C_3H_2F_6$ gas into the chamber to generate plasma, and etching the silicon-containing film in the substrate.

In one exemplary embodiment, the phosphorus halide gas contains at least one selected from the group consisting of a $PF_3$ gas, a $PF_5$ gas, a $POF_3$ gas, an $HPF_6$ gas, a $PCl_3$ gas, a $PCl_5$ gas, a $POCl_3$ gas, a $PBr_3$ gas, a $PBr_5$ gas, a $POBr_3$ gas, and a $PI_3$ gas.

In one exemplary embodiment, the process gas further contains at least one selected from the group consisting of a halogen-containing gas, a carbon-containing gas, an oxygen-containing gas, and a nitrogen-containing gas.

In one exemplary embodiment, the halogen-containing gas is at least one selected from the group consisting of a chlorine-containing gas, a bromine-containing gas, and an iodine-containing gas.

In one exemplary embodiment, the halogen-containing gas is at least one gas selected from the group consisting of $Cl_2$, $SiCl_2$, $SiCl_4$, $CCl_4$, $SiH_2Cl_2$, $Si_2Cl_6$, $CHCl_3$, $SO_2CO_2$, $BCl_3$, $PCl_3$, $PCl_5$, $POCl_3$, $Br_2$, HBr, $CBr_2F_2$, $C_2F_5Br$, $PBr_3$, $PBr_5$, $POBr_3$, $BBr_3$, HI, $CF_3I$, $C_2F_5I$, $C_3F_7I$, $IF_5$, $IF_7$, $I_2$, and $PI_3$.

In one exemplary embodiment, the carbon-containing gas is at least one selected from the group consisting of $C_aH_b$ gas, a $C_cF_d$ gas, and a $CH_eF_f$ gas, where a and b are integers greater than or equal to 1, c and d are integers greater than or equal to 1, and e and f are integers greater than or equal to 1.

In one exemplary embodiment, the nitrogen-containing gas is at least one selected from the group consisting of an $NF_3$ gas, an $N_2$ gas, and an $NH_3$ gas.

In one exemplary embodiment, the process gas further contains an oxygen-containing gas. The oxygen-containing gas is at least one selected from the group consisting of an $O_2$ gas, a CO gas, a $CO_2$ gas, an $H_2O$ gas, and an $H_2O_2$ gas.

In one exemplary embodiment, the process gas further contains at least one selected from the group consisting of a boron-containing gas and a sulfur-containing gas.

In one exemplary embodiment, the process gas further contains an inert gas.

In one exemplary embodiment, the silicon-containing film includes at least one selected from the group consisting of a silicon oxide film, a silicon nitride film, and a polysilicon film.

In one exemplary embodiment, the substrate includes a mask including an organic film or a metal-containing film. The organic film or the metal-containing film defines at least one opening in the silicon-containing film.

In one exemplary embodiment, the etching includes applying an electrical bias to a substrate support during a first period and a second period alternating with the first period. The electrical bias in the first period is zero or at a first level, and the electrical bias in the second period is at a second level higher than the first level.

In one exemplary embodiment, the etching includes providing radio frequency power to generate plasma to the substrate support or an upper electrode facing the substrate support during a third period and a fourth period alternating with the third period. The radio frequency power in the third period is zero or at a third level, and the radio-frequency power in the fourth period is at a fourth level higher than the third level. The second period and the fourth period at least partially overlap.

In one exemplary embodiment, the electrical bias is a pulsed voltage.

In one exemplary embodiment, the etching includes providing a direct-current voltage or low-frequency power to an upper electrode facing a substrate support.

In one exemplary embodiment, the etching includes a first process of setting the chamber to a first pressure, applying a first electrical bias to a substrate support, and etching the silicon-containing film, and a second process of setting the chamber to a second pressure, applying a second electrical bias to the substrate support, and etching the silicon-containing film. The first pressure differs from the second pressure or the first electrical bias differs from the second electrical bias, or the first pressure differs from the second pressure and the first electrical bias differs from the second electrical bias.

In one exemplary embodiment, the first pressure is higher than the second pressure.

In one exemplary embodiment, an absolute value of the first electrical bias is greater than an absolute value of the second electrical bias.

In one exemplary embodiment, the first process and the second process are repeated alternately.

A substrate processing method according to one exemplary embodiment includes providing a substrate with a silicon-containing film in a chamber, supplying a process gas containing a $C_xH_yF_z$ gas, a fluorine-containing gas, and a phosphorus-containing gas into the chamber to generate plasma, where x is an integer greater than or equal to 2, and y and z are integers greater than or equal to 1, and etching the silicon-containing film in the substrate.

In one exemplary embodiment, the fluorine-containing gas is a gas to produce an HF species in the chamber.

In one exemplary embodiment, the $C_xH_yF_z$ gas includes one or more $CF_3$ groups.

In one exemplary embodiment, the $C_xH_yF_z$ gas contains at least one selected from the group consisting of a $C_3H_2F_4$ gas, a $C_3H_2F_6$ gas, a $C_4H_2F_6$ gas, a $C_4H_2F_8$ gas, and a $C_5H_2F_6$ gas.

In one exemplary embodiment, the phosphorus-containing gas contains at least one selected from the group consisting of a $PF_3$ gas, a $PF_5$ gas, a $POF_3$ gas, an $HPF_6$ gas, a $PCl_3$ gas, a $PCl_5$ gas, a $POCl_3$ gas, a $PBr_3$ gas, a $PBr_5$ gas, a $POBr_3$ gas, a $PI_3$ gas, a $P_4O_{10}$ gas, a $P_4O_8$ gas, a $P_4O_6$ gas, a $PH_3$ gas, a $Ca_3P_2$ gas, an $H_3PO_4$ gas, and an $Na_3PO_4$ gas.

A substrate processing method according to one exemplary embodiment includes placing a substrate with a silicon-containing film on a substrate support in a chamber, generating plasma in the chamber, and etching the silicon-containing film using an HF species and a $C_xH_yF_z$ species in the plasma, where x is an integer greater than or equal to 2, and y and z are integers greater than or equal to 1. The plasma includes an active species of phosphorus and a greatest amount of the HF species.

A substrate processing apparatus according to one exemplary embodiment includes a chamber, a substrate support in the chamber, a plasma generator that provides electric power to generate plasma in the chamber, and a controller. The controller supplies a process gas containing an HF gas, and a phosphorus halide gas, and at least one gas selected from the group consisting of a $C_4H_2Fe$ gas, a $C_4H_2F_8$ gas, a $C_3H_2F_4$ gas, and a $C_3H_2F_6$ gas into the chamber and controls plasma generation with the electric power provided from the plasma generator to etch a silicon-containing film in a substrate supported on the substrate support.

One or more embodiments of the present disclosure will now be described with reference to the drawings. In the figures, the same or similar components are given the same reference numerals, and may not be described repeatedly. Unless otherwise specified, the positional relationships shown in the drawings are used to describe the vertical, lateral, and other positions. The drawings are not drawn to scale relative to the actual ratio of each component, and the actual ratio is not limited to the ratio in the drawings.

Structure of Substrate Processing Apparatus 1

FIG. 1 is a schematic diagram of a substrate processing apparatus 1 according to one exemplary embodiment. A substrate processing method according to one exemplary embodiment (hereinafter referred to as the processing method) may be used by the substrate processing apparatus 1.

The substrate processing apparatus 1 shown in FIG. 1 includes a chamber 10. The chamber 10 has an internal space 10*s*. The chamber 10 includes a chamber body 12 that is substantially cylindrical. The chamber body 12 is formed from, for example, aluminum. The chamber body 12 has an inner wall coated with an anticorrosive film. The anticorrosive film may be a film of ceramic such as aluminum oxide or yttrium oxide.

The chamber body 12 has a side wall having a port 12*p*. The substrate W is transferred between the internal space 10*s* and the outside of the chamber 10 through the port 12*p*. The port 12*p* is open and closed by a gate valve 12*g*. The gate valve 12*g* is on the side wall of the chamber body 12.

A support 13 is located on the bottom of the chamber body 12. The support 13 is formed from an insulating material. The support 13 is substantially cylindrical. The support 13 extends upward from the bottom of the chamber body 12 into the internal space 10*s*. The support 13 supports a substrate support 14. The substrate support 14 supports the substrate W in the internal space 10*s*.

The substrate support 14 includes a lower electrode 18 and an electrostatic chuck (ESC) 20. The substrate support 14 may further include an electrode plate 16. The electrode plate 16 is substantially disk-shaped and is formed from a conductor such as aluminum. The lower electrode 18 is on the electrode plate 16. The lower electrode 18 is substantially disk-shaped and is formed from a conductor such as aluminum. The lower electrode 18 is electrically coupled to the electrode plate 16.

The ESC 20 is on the lower electrode 18. The substrate W is placed on the upper surface of the ESC 20. The ESC 20 includes a body and an electrode. The body of the ESC 20 is substantially disk-shaped and is formed from a dielectric. In the ESC 20, the electrode is a film electrode located in the body. The electrode in the ESC 20 is coupled to a direct current (DC) power supply 20*p* through a switch 20*s*. A voltage is applied from the DC power supply 20*p* to the electrode in the ESC 20 to generate an electrostatic attraction between the ESC 20 and the substrate W. The substrate W is attracted to and held by the ESC 20 under the generated electrostatic attraction.

An edge ring 25 is placed on the substrate support 14. The edge ring 25 is annular. The edge ring 25 may be formed from silicon, silicon carbide, or quartz. The substrate W is placed in an area on the ESC 20 surrounded by the edge ring 25.

The lower electrode 18 has an internal channel 18*f* in which a heat-exchange medium (e.g., a refrigerant) is supplied through a pipe 22*a* from a chiller unit external to the chamber 10. The heat-exchange medium supplied to the channel 18*f* returns to the chiller unit through a pipe 22*b*. In the substrate processing apparatus 1, the temperature of the substrate W on the ESC 20 is adjusted through heat exchange between the heat-exchange medium and the lower electrode 18.

The substrate processing apparatus 1 includes a gas supply line 24. The gas supply line 24 supplies a heat-transfer gas (e.g., a He gas) from a heat-transfer gas supply assembly into a space between the upper surface of the ESC 20 and the back surface of the substrate W.

The substrate processing apparatus 1 further includes an upper electrode 30. The upper electrode 30 is located above the substrate support 14. The upper electrode 30 is supported in an upper portion of the chamber body 12 with a member 32. The member 32 is formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space 10*s*. The ceiling plate 34 may be formed from a low resistance conductor or a semiconductor that generates less Joule heat. The ceiling plate 34 has multiple gas outlet holes 34*a* that are through-holes in the thickness direction.

The support member 36 supports the ceiling plate 34 in a detachable manner. The support member 36 is formed from a conductive material such as aluminum. The support member 36 has an internal gas-diffusion space 36*a*. The support member 36 has multiple gas holes 36*b* that extend downward from the gas-diffusion space 36*a*. The gas holes 36*b* communicate with the respective gas outlet holes 34*a*. The support member 36 has a gas inlet 36*c*. The gas inlet 36*c* is connected to the gas-diffusion space 36*a*. The gas inlet 36*c* is also connected to a gas supply pipe 38.

The gas supply pipe 38 is connected to a set of gas sources 40 through a set of flow controllers 41 and a set of valves 42. The flow controller set 41 and the valve set 42 are included in a gas supply unit. The gas supply unit may further include the gas source set 40. The gas source set 40 includes multiple gas sources. The gas sources include the sources of the process gas used with the processing method. The flow controller set 41 includes multiple flow controllers. The flow controllers in the flow controller set 41 are mass flow controllers or pressure-based flow controllers. The valve set 42 includes multiple open-close valves. The gas sources in the gas source set 40 are connected to the gas supply pipe 38 through the respective flow controllers in the flow controller set 41 and through the respective open-close valves in the valve set 42.

The substrate processing apparatus 1 includes a shield 46 along an inner wall of the chamber body 12 and along the periphery of the support 13 in a detachable manner. The shield 46 prevents a reaction product from accumulating on the chamber body 12. The shield 46 includes, for example, an aluminum base coated with an anticorrosive film. The anticorrosive film may be a film of ceramic such as yttrium oxide.

A baffle plate 48 is located between the support 13 and the side wall of the chamber body 12. The baffle plate 48 includes, for example, an aluminum member coated with an anticorrosive film (e.g., an yttrium oxide film). The baffle plate 48 has multiple through-holes. The chamber body 12 has an outlet 12*e* in its bottom below the baffle plate 48. The outlet 12*e* is connected to an exhaust device 50 through an exhaust pipe 52. The exhaust device 50 includes a pressure control valve and a vacuum pump such as a turbomolecular pump.

The substrate processing apparatus 1 includes a radio frequency (RF) power supply 62 and a bias power supply 64. The RF power supply 62 generates RF power HF. The RF power HF has a first frequency suitable for generating plasma. The first frequency ranges from, for example, 27 to 100 MHz. The RF power supply 62 is coupled to the lower electrode 18 through an impedance matching circuit, or matcher 66, and through the electrode plate 16. The matcher 66 includes a circuit for matching the impedance of a load (the lower electrode 18) for the RF power supply 62 and the output impedance of the RF power supply 62. The RF power supply 62 may be coupled to the upper electrode 30 through the matcher 66. The RF power supply 62 serves as an exemplary plasma generator.

The bias power supply 64 generates an electrical bias. The bias power supply 64 is electrically coupled to the lower electrode 18. The electrical bias has a second frequency lower than the first frequency. The second frequency ranges from, for example, 400 kHz to 13.56 MHz. When used in addition to the RF power HF the electrical bias is applied to the substrate support 14 to draw ions toward the substrate W. In one example, the electrical bias is applied to the lower electrode 18. The electrical bias applied to the lower electrode 18 changes the potential of the substrate W on the substrate support 14 in periods defined by the second frequency. The electrical bias may be applied to a bias electrode located in the ESC 20.

In one embodiment, the electrical bias may be RF power LF with the second frequency. When used in addition to the RF power HF, the RF power LF serves as RF bias power for drawing ions toward the substrate W The bias power supply 64 that generates RF power LF is coupled to the lower electrode 18 through an impedance matching circuit, or matcher 68, and through the electrode plate 16. The matcher 68 includes a circuit for matching the impedance of a load (the lower electrode 18) for the bias power supply 64 and the output impedance of the bias power supply 64.

The RF power LF alone may be used to generate plasma, without the RF power HF being used. In other words, a single source of RF power may be used to generate plasma. In this case, the RF power LF may have a frequency higher than 13.56 MHz, or for example, 40 MHz. In this case, the substrate processing apparatus 1 may not include the RF power supply 62 and the matcher 66. The bias power supply 64 serves as an exemplary plasma generator.

In another embodiment, the electrical bias may be a pulsed voltage. In this case, the bias power supply may be a DC power supply. The bias power supply may apply a pulsed voltage or may include a device for pulsing the voltage downstream from the bias power supply. In one example, a pulsed voltage is applied to the lower electrode 18 to cause the substrate W to have a negative potential. The pulsed voltage may have a square wave pulse, a triangular wave pulse, an impulse, or any other waveforms.

The pulsed voltage occurs in periods defined by the second frequency. Each period of the pulsed voltage includes two periods. The pulsed voltage is negative in one of the two periods. The voltage has a higher level (a greater absolute value) in one period than in the other period. The voltage may be negative or positive in the other period. The negative voltage in the other period may have a level higher than zero or a level of zero. In this embodiment, the bias power supply 64 is coupled to the lower electrode 18 through a low-pass filter and through the electrode plate 16. The bias power supply 64 may be coupled to the bias electrode in the ESC 20, instead of to the lower electrode 18.

In one embodiment, the bias power supply 64 may apply a continuous-wave electrical bias to the lower electrode 18. In other words, the bias power supply 64 may continuously apply the electrical bias to the lower electrode 18.

In some embodiments, the bias power supply 64 may apply a pulsed electrical bias to the lower electrode 18. The pulsed electrical bias may be periodically applied to the lower electrode 18. The pulsed electrical bias occurs in periods defined by a third frequency. The third frequency is lower than the second frequency. The third frequency ranges from, for example, 1 Hz to 200 kHz inclusive. In some embodiments, the third frequency may range from 5 Hz to 100 kHz inclusive.

Each period of the pulsed electrical bias includes two periods, or specifically, a period H and a period L. The electrical bias has a higher level (or a higher level of the pulsed electrical bias) in the period H than in the period L. In other words, the level of the electrical bias may be increased or decreased to apply a pulsed electrical bias to the lower electrode 18. The electrical bias may have a level higher than zero in the period L. In some embodiments, the electrical bias may have a level of zero in the period L. In other words, the pulsed electrical bias may be applied to the lower electrode 18 by repeatedly turning on and off the electrical bias applied to the lower electrode 18. When the electrical bias is RF power LF, the power level of the electrical bias is the same level as the power level of the RF power LF. The RF power LF used as the pulsed electrical bias has a level of 2 kW or more. When the electrical bias is a pulsed negative DC voltage, the power level of the electrical bias is a level equivalent to the effective value of the absolute value of the negative DC voltage. The duty ratio of the pulsed electrical bias, or the ratio of the period H to the period of the pulsed electrical bias, ranges from, for example, 1 to 80% inclusive. In some embodiments, the duty ratio of the pulsed electrical bias may range from 5 to 50% inclusive or 50 to 99% inclusive. Of the periods during which the electrical bias is applied, the period L corresponds to the first period described above, and the period H corresponds to the second period described above. The level of the electrical bias in the period L corresponds to zero or at the first level described above, and the level of the electrical bias in the period H corresponds to the second level described above.

In one embodiment, the RF power supply 62 may provide continuous-wave RF power HF. In other words, the RF power supply 62 may continuously provide the RF power HF.

In some embodiments, the RF power supply 62 may provide pulsed-RF power HF. The pulsed-RF power HF may be provided periodically. The pulsed-RF power HF occurs in periods defined by a fourth frequency. The fourth frequency is lower than the second frequency. In one embodiment, the fourth frequency is the same as the third frequency. Each period of the pulsed-RF power HF includes two periods, or specifically, a period H and a period L. The RF power HF has a higher power level in the period H than in the other period, or the period L. The RF power HF may have a power level higher than zero or a power level of zero in the period L. Of the periods during which the RF power HF is supplied, the period L corresponds to the third period described above, and the period H corresponds to the fourth period described above. The level of the RF power HF in the period L corresponds to zero or at the third level described above, and the level of the electrical bias in the period H corresponds to the fourth level described above.

The periods of the pulsed-RF power HF may be synchronized with the periods of the pulsed electrical bias. The periods H of the pulsed-RF power HF may be synchronized with the periods H of the pulsed electrical bias. In some embodiments, the periods H of the pulsed-RF power HF may not be synchronized with the periods H of the pulsed electrical bias. The periods H of the pulsed-RF power HF may have the same durations as or may have durations different from the periods H of the pulsed electrical bias. The periods H of the pulsed-RF power HF may partially or entirely overlap the periods H of the pulsed electrical bias.

Figure 2:
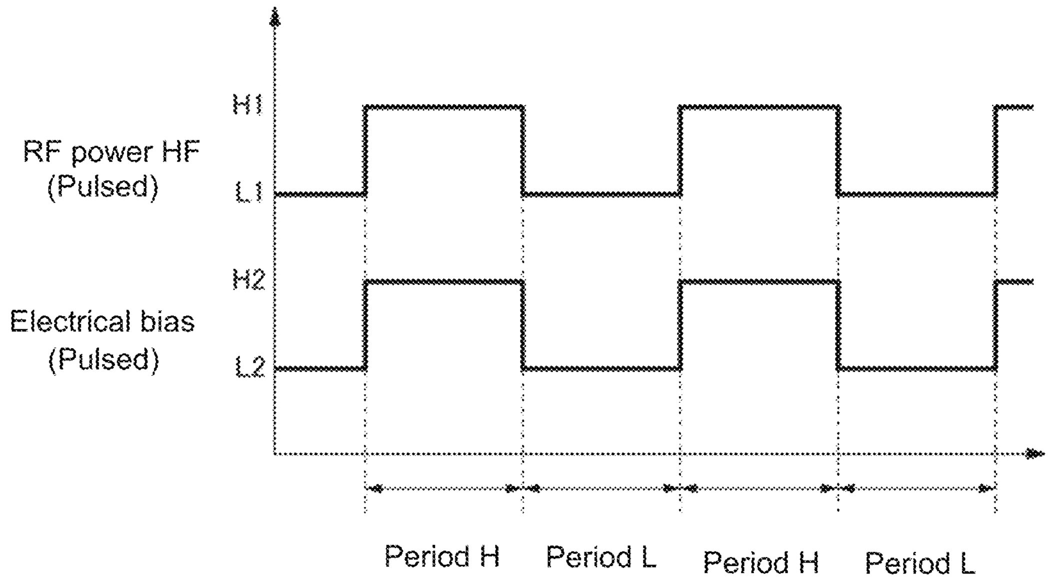
FIG. 2 is a timing chart showing example radio frequency (RF) power HF and an example electrical bias.

FIG. 2 is a timing chart showing example RF power HF and an example electrical bias. In FIG. 2, the RF power HF and the electrical bias are both provided in pulses. In FIG. 2, the horizontal axis indicates time. In FIG. 2, the vertical axis indicates the power level of the RF power HF and the power level of the electrical bias. The RF power HF at L I indicates the RF power HF not being provided or being provided at a power level lower than at H1. The electrical bias at L2 indicates the electrical bias not being applied or being applied at a power level lower than at H2. When the electrical bias is a pulsed negative DC voltage, the power level of the electrical bias is a level equivalent to the effective value of the absolute value of the negative DC voltage. The power level of the RF power HF and the power level of the electrical bias shown in FIG. 2 do not represent the relative relationship between them, but may be set as appropriate. In the example in FIG. 2, the periods of the pulsed-RF power HF are synchronized with the periods of the pulsed electrical bias. The periods H of the pulsed-RF power HF have the same durations as the periods H of the pulsed electrical bias, and the periods L of the pulsed-RF power HF have the same durations as the periods L of the pulsed electrical bias.

Referring back to FIG. 1, the substrate processing apparatus 1 further includes a power supply 70. The power supply 70 is coupled to the upper electrode 30. In one embodiment, the power supply 70 may provide a DC voltage or low-frequency power to the upper electrode 30 during the plasma processing. For example, the power supply 70 may provide a negative DC voltage or periodically provide low-frequency power to the upper electrode 30. The DC voltage or the low-frequency power may be provided in pulses or continuously. In this embodiment, positive ions in the internal space 10*s* for plasma processing are attracted to and collide with the upper electrode 30. This causes secondary electrons to be emitted from the upper electrode 30. The emitted secondary electrons modify a mask film MK and improve the etching resistance of the mask film MK. Secondary electrons also increase the plasma density. The emitted secondary electrons neutralize the charged substrate W, thus allowing more ions to be directed straight into recesses formed by etching. For the upper electrode 30 formed from a silicon-containing material, silicon is emitted together with secondary electrons upon collision of the positive ions. The emitted silicon combines with oxygen in the plasma and is deposited on the mask as a silicon oxide compound, serving as a protective film. As described above, the DC voltage or the low-frequency power provided to the upper electrode 30 reduces feature failures in the recesses formed by etching and improves the etching rate, in addition to improving the selectivity.

The gas supply unit supplies a gas into the internal space 10*s* for plasma processing in the substrate processing apparatus 1. The RF power HF, the electrical bias, or both are provided to form an RF electric field between the upper electrode 30 and the lower electrode 18. The resultant RF electric field generates plasma from the gas in the internal space 10*s*.

The substrate processing apparatus 1 may further include a controller 80. The controller 80 may be a computer including a processor, a storage such as a memory, an input device, a display, and an input-output interface for signals. The controller 80 controls the components of the substrate processing apparatus 1. An operator can use the input device in the controller 80 to input a command or perform other operations for managing the substrate processing apparatus 1. The display in the controller 80 can display and visualize the operating state of the substrate processing apparatus 1. The storage stores control programs and recipe data. The control program is executed by the processor to perform the processing in the substrate processing apparatus 1. The processor executes the control program to control the components of the substrate processing apparatus 1 in accordance with the recipe data. In one exemplary embodiment, the controller 80 may be partially or entirely included in a device external to the substrate processing apparatus 1.

Structure of Substrate Processing System PS

Figure 3:
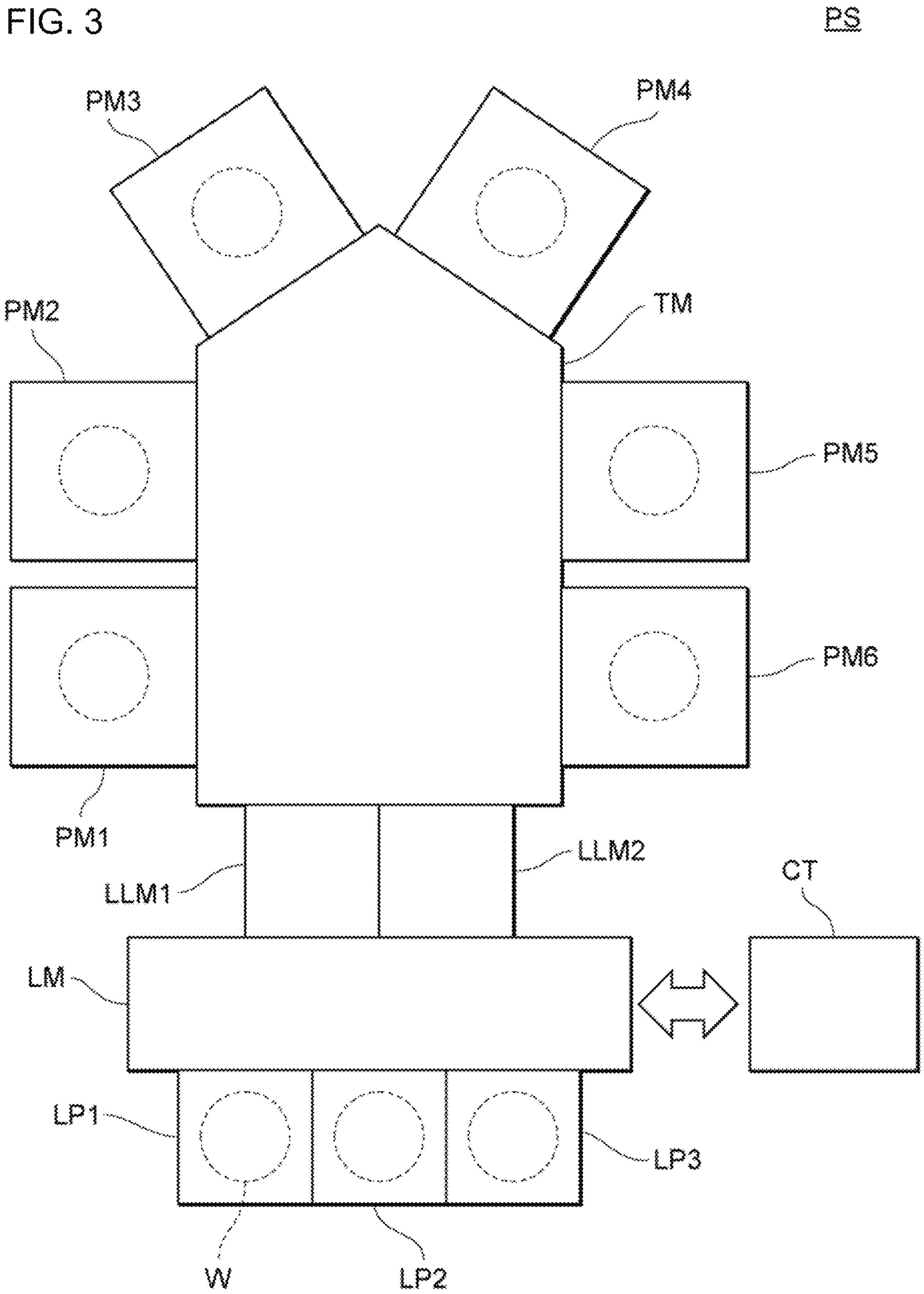
FIG. 3 is a schematic diagram of a substrate processing system PS.

FIG. 3 is a schematic diagram of a substrate processing system PS according to one exemplary embodiment. The processing method may be used by the substrate processing system PS.

The substrate processing system PS includes substrate processing chambers PM1 to PM6 (hereinafter also collectively referred to as the substrate processing modules PM), a transfer module TM, loadlock modules LLM1 and LLM2 (hereinafter also collectively referred to as the loadlock modules LLM), a loader module LM, and load ports LP1 to LP3 (hereinafter also collectively referred to as the load ports LP). A controller CT controls the components of the substrate processing system PS to perform predetermined processing on a substrate W.

Each substrate processing module PM performs etching, trimming, film deposition, annealing, doping, lithography, cleaning, ashing, and other processing on the substrate W inside the substrate processing module PM. The substrate processing modules PM may include a measurement module that may measure, for example, the thickness of a film formed on the substrate W and the dimensions of a pattern formed on the substrate W. The substrate processing apparatus 1 shown in FIG. 1 is an example of the substrate processing module PM.

The transfer module TM includes a transfer device that transfers the substrate W between the substrate processing modules PM or between a substrate processing module PM and a loadlock module LLM. The substrate processing modules PM and the loadlock modules LLM are located adjacent to the transfer module TM. The transfer module TM, the substrate processing modules PM, and the loadlock modules LLM are spatially isolated or connected through gate valves that can be open and closed.

The loadlock modules LLM1 and LLM2 are located between the transfer module TM and the loader module LM. Each loadlock module LLM can switch its internal pressure between an ambient atmosphere and a vacuum atmosphere. The loadlock module LLM transfers the substrate W from the loader module LM, which is in the ambient atmosphere, to the transfer module TM, which is in the vacuum atmosphere, or from the transfer module TM, which is in the vacuum atmosphere, to the loader module LM, which is in the ambient atmosphere.

The loader module LM includes a transfer device that transfers the substrate W between the loadlock module LLM and a load port LP. The load port LP can receive, for example, a front-opening unified pod (FOUP) that can store 25 substrates W or an empty FOUP. The loader module LM unloads a substrate W from the FOUP in the load port LP and transfers the substrate W to the loadlock module LLM. The loader module LM unloads a substrate W from the loadlock module LLM and transfers the substrate W to the FOUP in the load port LP.

The controller CT controls the components of the substrate processing system PS to perform predetermined processing on the substrate W. The controller CT stores recipes containing process procedures, process conditions, transfer conditions, or other sets of data. The controller CT controls the components of the substrate processing system PS to perform predetermined processing on a substrate W in accordance with the recipes. The controller CT may implement a part or all of the functions of the controller 80 in the substrate processing apparatus 1 shown in FIG. 1.

Exemplary Substrate W

Figure 4:
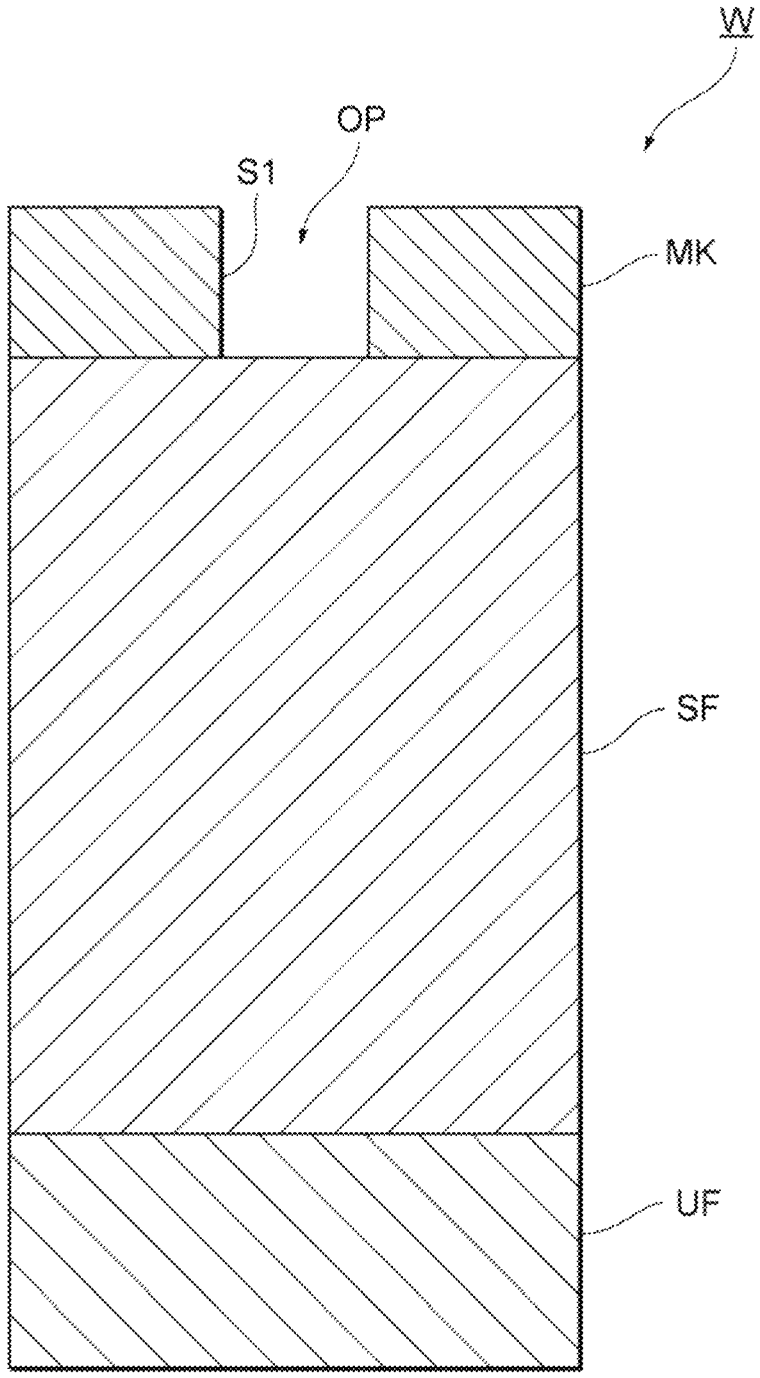
FIG. 4 is a diagram of a substrate W showing an example cross-sectional structure.

FIG. 4 is a diagram of the substrate W showing an example cross-sectional structure. The substrate W is an example substrate on which the processing method may be performed. The substrate W includes a silicon-containing film SF. The substrate W may include an underlying film UF and a mask film MK. As shown in FIG. 4, the substrate W may be formed by stacking the underlying film UF, the silicon-containing film SF, and the mask film MK in this order.

The underlying film UF may be, for example, a silicon wafer or an organic film, a dielectric film, a metal film, or a semiconductor film formed on the silicon wafer. The underlying film UF may include multiple films stacked on one another.

The silicon-containing film SF may be a silicon oxide film, a silicon nitride film, a silicon oxynitride film (SiON film), or a Si-ARC film. The silicon-containing film SF may include a polycrystalline silicon film. The silicon-containing film SF may include multiple films stacked on one another. For example, the silicon-containing film SF may include silicon oxide films and polycrystalline silicon films that are alternately stacked on one another. In one example, the silicon-containing film SF is a stacked film including silicon oxide films and silicon nitride films that are alternately stacked on one another.

The underlying film UF, the silicon-containing film SF, or both the films may be formed by a method such as chemical vapor deposition (CVD) and spin coating. The underlying film UF, the silicon-containing film SF, or both the films may be a flat film or an uneven film.

The mask film MK is formed on the silicon-containing film SF. The mask film MK defines at least one opening OP on the silicon-containing film SF. The opening OP is a space on the silicon-containing film SF and is surrounded by aside wall S1 of the mask film MK. In other words, in FIG. 4, the silicon-containing film SF has an area covered by the mask film MK and an area exposed at the bottom of the opening OP.

The opening OP may have any feature in a plan view of the substrate W (when the substrate W is viewed from the top toward the bottom in FIG. 4). The opening feature may be, for example, a hole, a line, or a combination of a hole and a line. The mask film MK may have multiple side walls S1 that may define multiple openings OP. The multiple openings OP may be slits arranged in a pattern of lines and spaces at regular intervals. The multiple openings OP may be holes arranged in a patterned array.

The mask film MK is, for example, an organic film or a metal-containing film. Examples of the organic film include a spin-on carbon (SOC) film, an amorphous carbon film, and a photoresist film. The metal-containing film may contain, for example, tungsten, tungsten carbide, or titanium nitride. The mask film MK may be formed by CVD, spin coating or other methods. The opening OP may be formed by etching the mask film MK. The mask film MK may be formed by lithography.

Exemplary Processing Method

Figure 5:
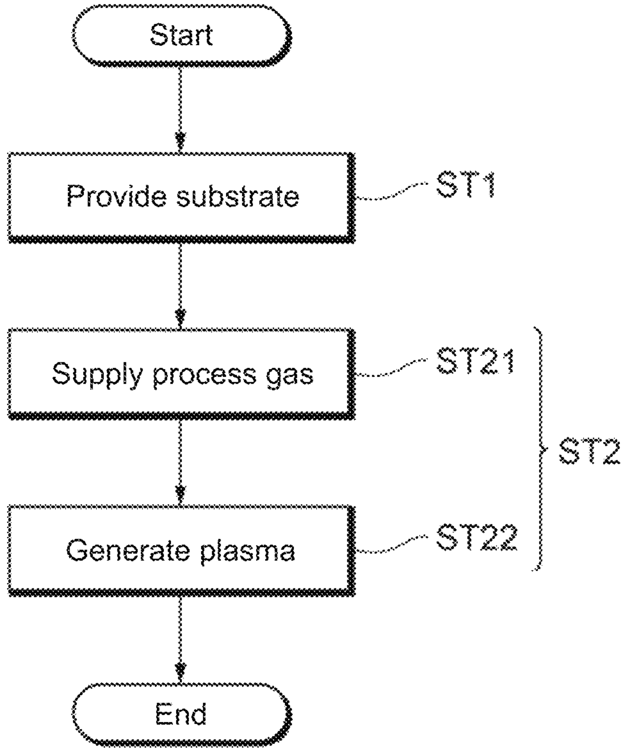
FIG. 5 is a flowchart of a processing method.

FIG. 5 is a flowchart of the processing method. The processing method includes providing a substrate (step ST1) and etching (step ST2). The controller 80 shown in FIG. 1 controls the components of the substrate processing apparatus 1 to perform the processing method on a substrate W shown in FIG. 4.

Step ST1: Providing Substrate

In step ST1, a substrate W is provided in the internal space 10*s* of the chamber 10. In the internal space 10*s*, the substrate W is placed on the upper surface of the substrate support 14 and held by the ESC 20. The processing for forming each component of the substrate W may be at least partly performed in the internal space 10*s*. All or a part of the components of the substrate W may be formed in a device or a chamber external to the substrate processing apparatus 1. The resultant substrate W may then be loaded into the internal space 10*s* and placed on the upper surface of the substrate support 14.

Step ST2: Etching

In step ST2, the silicon-containing film SF in the substrate W is etched. Step ST2 includes supplying a process gas (step ST21) and generating plasma (step ST22). The silicon-containing film SF is etched with an active species (ions or radicals) in plasma generated from the process gas.

In step ST21, the gas supply unit supplies the process gas into the internal space 10*s*. The process gas contains, as a reaction gas, a fluorine-containing gas, a $C_xH_yF_z$ (a gas different from the fluorine-containing gas described above, where x is an integer greater than or equal to 2, and y and z are integers greater than or equal to 1) gas (hereinafter also referred to as a $C_xH_yF_z$ gas), and a phosphorus-containing gas. In the present embodiment, the reaction gas does not include any noble gas such as Ar, unless otherwise stated.

The $C_xH_yF_z$ gas may be, for example, at least one selected from the group consisting of a $C_2HF_5$ gas, a $C_2H_2F_4$ gas, a $C_2H_3F_3$ gas, a $C_2H_4F_2$ gas, a $C_3HF_7$ gas, a $C_3H_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_5$ gas, a $C_5H_2F_6$ gas, a $C_5H_2F_{10}$ gas, and a $C_5H_3F_7$ gas. In one example, the $C_xH_yF_z$ gas may be at least one selected from the group consisting of a $C_3H_2F_4$ gas, a $C_3H_2F_6$ gas, a $C_4H_2F_6$ gas, and a $C_4H_2F_8$ gas. In another example, the $C_xH_yF_z$ gas may be at least one selected from the group consisting of a $C_3H_2F_4$ gas, a $C_3H_2F_6$ gas, a $C_4H_2F_6$ gas, a $C_4H_2F_5$ gas, and a $C_5H_2F_6$ gas. For a $C_4H_2F_6$ gas as the $C_xH_yF_z$ gas, for example, $C_4H_2F_6$ may be linear or cyclic.

The plasma generated from the process gas containing the $C_xH_yF_z$ gas contains $C_xH_yF_z$ species that dissociate from the $C_xH_yF_z$ gas. The $C_xH_yF_z$ species include many $C_xH_yF_z$ radicals containing two or more carbon atoms (e.g., $C_2H_2F$ radicals, $C_2H_2F_2$ radicals, $C_3HF_3$ radicals, hereinafter referred to as $C_xH_yF_z$-based radicals). The $C_xH_yF_z$-based radicals form a protective film on the surface of the mask film MK to protect the surface. The protective film may reduce the likelihood of the mask film MK being etched in etching the silicon-containing film SF. The $C_xH_yF_z$-based radicals thus may improve the selectivity (a value obtained by dividing the etching rate of the silicon-containing film SF by the etching rate of the mask film MK) of the silicon-containing film SF to the mask film MK in etching the silicon-containing film SF.

The plasma generated from the process gas containing the $C_xH_yF_z$ gas contains many hydrogen fluoride (HF) species dissociated from the $C_xH_yF_z$ gas, many HF species further dissociated from the $C_xH_yF_z$ species, or many HF species dissociated from both the $C_xH_yF_z$ gas and the $C_xH_yF_z$ species. The HF species include at least one of a hydrogen fluoride gas, radicals, or ions. The HF species serve as an etchant for the silicon-containing film SF. The etching rate of the silicon-containing film SF can be improved by many HF species contained in the plasma. The $C_xH_yF_z$ gas may include one or more $CF_3$ groups. When the $C_xH_yF_z$ gas includes the $CF_3$ group, and, for example, the single CH group is bonded to the $CF_3$ group, the molecular structure of the $C_xH_yF_z$ gas allows HF to be easily dissociated and allows the plasma to contain more HF species.

The process gas may contain a $C_xF_z$ (where x is an integer greater than or equal to 2, and z is an integer greater than or equal to 1) gas in place of part or all of the $C_xH_yF_z$ gas described above. More specifically, the $C_xF_z$ gas may be at least one selected from the group consisting of $C_2F_2$, $C_2F_4$, $C_3F_8$, $C_4F_6$, $C_4F_8$, and $C_5F_8$. This can reduce the amount of hydrogen in the plasma and may reduce the likelihood of, for example, morphology deteriorating and moisture in the chamber 10 increasing with excess hydrogen. The term morphology herein refers to the characteristics associated with the feature of the mask such as the surface condition of the mask film MK and the roundness of the opening OP.

The flow rate of the $C_xH_yF_z$ gas may be less than or equal to 20% by volume of the total flow rate of the reaction gas. The flow rate of the $C_xH_yF_z$ gas may be, for example, lower than or equal to 15% by volume, less than or equal to 10% by volume, or less than or equal to 5% by volume of the total flow rate of the reaction gas. At the flow rate of the $C_xH_yF_z$ gas less than or equal to 20% by volume of the total flow rate of the reaction gas, this structure may reduce the likelihood of excess deposition of carbon on the side walls of the mask film MK and the silicon-containing film SF during etching as well as blockage of the opening OP in the mask film MK.

The fluorine-containing gas may be a gas that can produce HF species in the chamber 10 during plasma processing. The HF species include at least one of a hydrogen fluoride gas, radicals, or ions. In one example, the fluorine-containing gas may be an HF gas or a hydrofluorocarbon gas. The fluorine-containing gas may be a mixture of gases containing hydrogen and fluorine sources. The hydrogen source may be, for example, $H_2$, $NH_3$, $H_2O$, $H_2O_2$, or hydrocarbon (e.g., $CH_4$ or $C_3H_6$). The fluorine source may be $NF_3$, $SF_6$, $WF_6$, $XeF_2$, fluorocarbon, or hydrofluorocarbon. The fluorine-containing gas is hereinafter also referred to as an HF-based gas. The plasma generated from the process gas containing an HF-based gas contains many HF species (etchant). The flow rate of the HF-based gas may be higher than the flow rate of the $C_xH_yF_z$ gas. The HF-based gas may be a main etchant gas. The HF-based gas may have the highest flow rate as a percentage of the total flow rate of the reaction gas, for example, higher than or equal to 70% by volume of the total flow rate of the reaction gas. The HF-based gas may be less than or equal to 96% by volume of the total flow of the reaction gas.

The phosphorus-containing gas may protect the side wall of the silicon-containing film SF and facilitate the adsorption of the etchant at a bottom BT of the silicon-containing film SF during etching of the silicon-containing film SF. The phosphorus-containing gas may be at least one selected from the group consisting of a $PF_3$ gas, a $PF_5$ gas, a $POF_3$ gas, an $HPF_6$ gas, a $PCl_3$ gas, a $PCl_5$ gas, a $POCl_3$ gas, a $PBr_3$ gas, a $PBr_5$ gas, a $POBr_3$ gas, a $PI_3$ gas, a $P_4O_{10}$ gas, a $P_4O_8$ gas, a $P_4O_6$ gas, a $PH_3$ gas, a $Ca_3P_2$ gas, an $H_3PO_4$ gas, and an $Na_3PO_4$ gas. Of these gases, the phosphorus-containing gas may be a phosphorus halide-containing gas such as a $PF_3$ gas, a $PF_5$ gas, and a $PCl_3$ gas, or a fluoride gas such as a $PF_3$ gas and a $PF_5$ gas.

The process gas may further contain, as the reaction gas, at least one selected from the group consisting of a halogen-containing gas, a carbon-containing gas, a nitrogen-containing gas, and an oxygen-containing gas. In one example, the process gas further contains an oxygen-containing gas as the reaction gas. In another example, the process gas further contains, as the reaction gas, an oxygen-containing gas, as well as a halogen-containing gas, a carbon-containing gas, or both the gases.

The halogen-containing gas may allow adjustment of the features of the mask film MK and the silicon-containing film SF in etching. The halogen-containing gas may be a gas containing halogen elements other than fluorine. The halogen-containing gas may allow adjustment of the features of the mask film MK and the silicon-containing film SF in etching. The halogen-containing gas may be at least one of a chlorine-containing gas, a bromine-containing gas, or an iodine-containing gas. The chlorine-containing gas may be a gas such as $Cl_2$, $SiCl_2$, $SiCl_4$, $CCl_4$, $SiH_2Cl_2$, $Si_2Cl_6$, $CHCl_3$, $SO_2Cl$, $BCl_3$, $PCl_3$, $PCl_5$, and $POCl_3$. The bromine-containing gas may be a gas such as $Br_2$, HBr, $CBr_2F_2$, $C_2F_5Br$, $PBr_3$, $PBr_5$, $POBr_3$, and $BBr_3$. The iodine-containing gas may be a gas such as HI, $CF_3I$, $C_2F_5I$, $C_3F_7I$, $IF_5$, $IF_7$, $I_2$, and $PI_3$. In one example, the halogen-containing gas may be at least one selected from the group consisting of a $Cl_2$ gas, a $Br_2$ gas, an HBr gas, a $CF_3I$ gas, an $IF_7$ gas, and $C_2F_5Br$ gas. In another example, the halogen-containing gas may be a $Cl_2$ gas or an HBr gas.

The carbon-containing gas may deposit carbon on the surface of the mask film MK in etching to protect the surface. The carbon-containing gas may be at least one selected from the group consisting of a $C_aH_b$ (where a and b are integers greater than or equal to 1) gas, a $C_cF_d$ (where c and d are integers greater than or equal to 1) gas, and a $CH_eF_f$ (where e and f are integers greater than or equal to 1) gas. The $C_aH_b$ gas may be, for example, a $CH_4$ gas or a $C_3H_6$ gas. The $C_cF_d$ gas may be, for example, a $CF_4$ gas, a $C_3FB$ gas, a $C_4F_6$ gas, or a $C_4F_8$ gas. The $CH_cF_f$ gas may be, for example, a $CH_2F_2$ gas, a $CHF_3$ gas, or a $CH_3F$ gas.

The nitrogen-containing gas may reduce the likelihood of the blockage of the opening OP in the mask film MK in etching. The nitrogen-containing gas may be, for example, at least one selected from the group consisting of an $NF_3$ gas, an $N_2$ gas, and an $NH_3$ gas.

The oxygen-containing gas, similarly to a nitrogen-containing gas, may reduce the likelihood of the blockage of the opening OP in the mask film MK in etching. The oxygen-containing gas may be, for example, at least one gas selected from the group consisting of $O_2$, CO, $CO_2$, $H_2O$, and $H_2O_2$. In one example, the process gas contains an oxygen-containing gas other than $H_2O$, or specifically, at least one gas selected from the group consisting of $O_2$, CO, $CO_2$, and $H_2O_2$. The oxygen-containing gas may cause less damage to the mask film MK and may reduce the likelihood of morphological deterioration.

Figure 6:
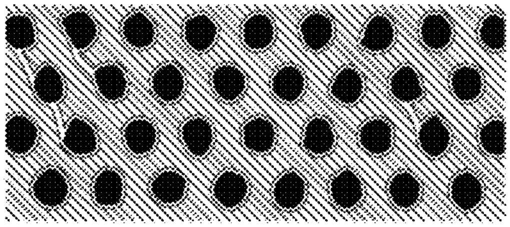
FIG. 6 is a diagram of example features of mask films MK after etching.
Figure 6:
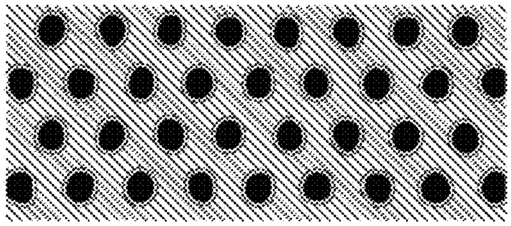
Figure 6:
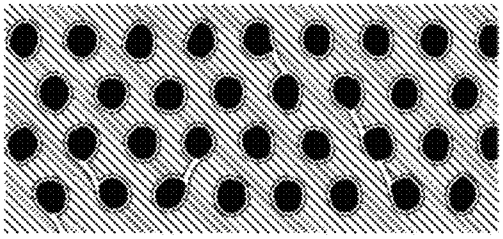
Figure 6:
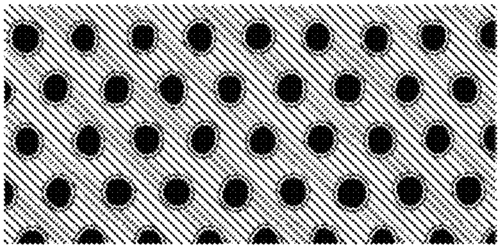

FIG. 6 is a diagram of example features of mask films MK after etching. FIG. 6 shows example features of the mask films MK (in a plan view) on sample substrates with the same structure as the substrate W etched in the substrate processing apparatus 1. In FIG. 6, the No. field shows the sample number for each etched sample substrate. The Process Gas field shows each process gas used for etching. In this field, A indicates a process gas (hereinafter, process gas A) containing an HF gas, a $C_4H_2F_6$ gas, an $O_2$ gas, an $NF_3$ gas, an HBr gas, and a $Cl_2$ gas. The process gas A contains greater than or equal to 80% by volume of the HF gas of the total flow rate of the reaction gas and 4 to 5% by volume of the $O_2$ gas of the total flow rate of the reaction gas. In the Process Gas field, B indicates a process gas (process gas B) with the same compositions as the process gas A but excluding an $NF_3$ gas and thus having a higher flow rate of the $O_2$ gas to compensate the flow rate of the $NF_3$ gas. The process gas B contains 6 to 7% by volume of the $O_2$ gas of the total flow rate of the reaction gas. The Voltage to Upper Electrode field either shows Yes, indicating that a DC voltage with negative polarity is provided to the upper electrode 30 in the substrate processing apparatus 1 during etching, or shows No, indicating that the DC voltage with negative polarity is not provided to the upper electrode 30. The Mask Feature field in FIG. 6 reveals that, when the process gas A containing $NF_3$ is used (samples 1 and 3), the openings OP have lower roundness irrespective of whether the Voltage to Upper Electrode field shows Yes or No and steps are observed on parts of the surface of the mask film MK. In contrast, when the process gas B containing no $NF_3$ gas and having a higher flow rate of the $O_2$ gas is used (samples 2 and 4), the openings OP have higher roundness, and no steps are observed on the surface of the mask film MK, showing that the morphology of the mask film MK is improved, as compared with when the process gas A is used (samples 1 and 3).

The presence of an oxygen-containing gas in addition to a phosphorus-containing gas can further facilitate adsorption of the etchant at the bottom BT of the silicon-containing film SF. This further improves the etching rate of the silicon-containing film SF.

The process gas may contain a boron-containing gas such as $BF_3$, $BCl_3$, $BBr_3$, and $B_2H_6$. The process gas may also contain a sulfur-containing gas such as $SF_6$ and COS.

The process gas may contain an inert gas (a noble gas such as Ar) in addition to the reaction gas described above.

The pressure of the process gas supplied into the internal space 10*s* is adjusted by controlling the pressure control valve of the exhaust device 50 connected to the chamber body 12. The pressure of the process gas may be, for example, from 5 to 100 mTorr (0.7 to 13.3 Pa) inclusive, from 10 to 60 mTorr (1.3 to 8.0 Pa) inclusive, or from 20 to 40 mTorr (2.7 to 5.3 Pa) inclusive.

In step ST22, the plasma generator (the RF power supply 62, the bias power supply 64, or both) provides the RF power, the electrical bias, or both. This generates an RF electric field between the upper electrode 30 and the substrate support 14 to generate plasma from the process gas in the internal space 10*s*. An active species such as ions and radicals in the generated plasma are attracted to the substrate W to etch the substrate W.

Figure 7:
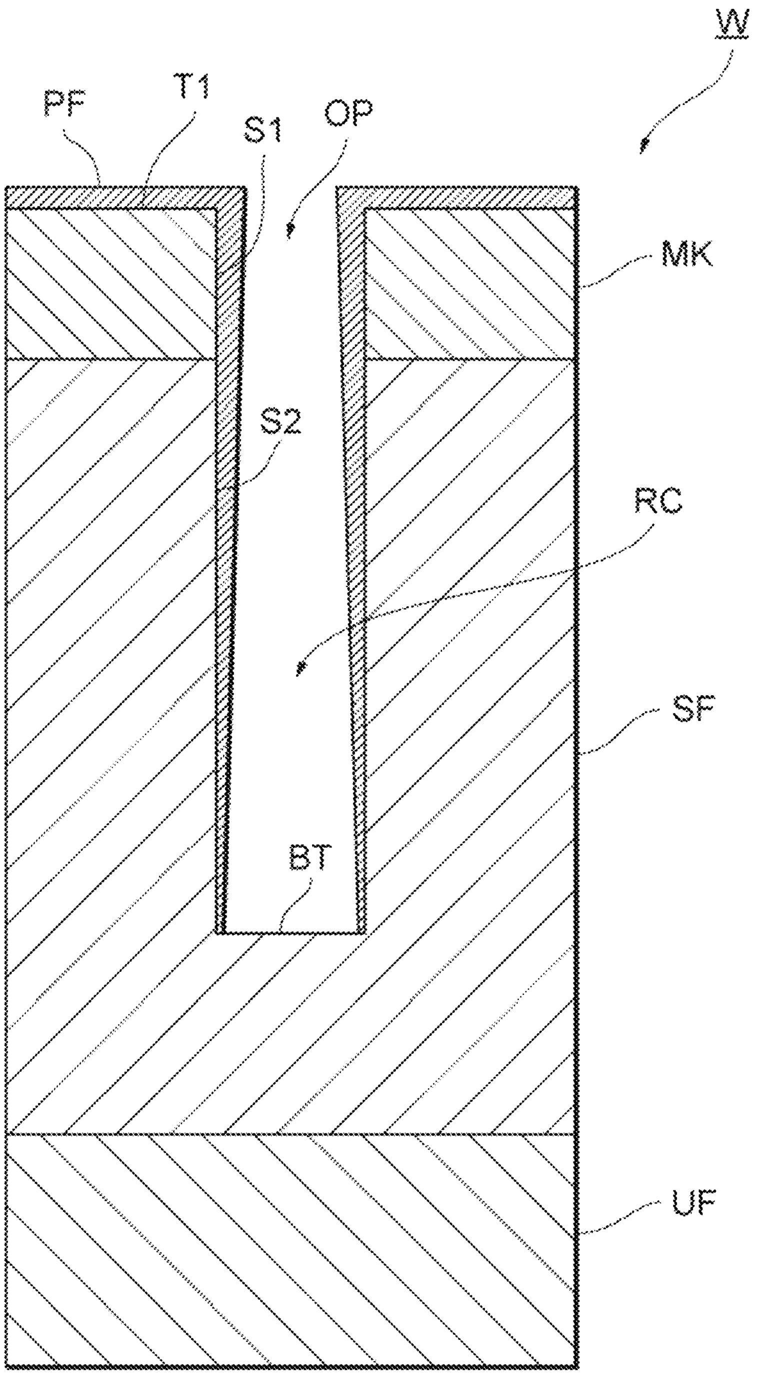
FIG. 7 is a diagram of the substrate W in step ST22 showing an example cross-sectional structure.

FIG. 7 is a diagram of the substrate W in step ST22 showing an example cross-sectional structure. During the processing in step ST22, the mask film MK serves as a mask, and a portion of the silicon-containing film SF corresponding to the opening OP in the mask film MK is etched in the depth direction (from the top to the bottom in FIG. 7) to form the recess RC. The recess RC is a space surrounded by a side wall S2 of the silicon-containing film SF. The recess RC formed in step ST22 may have an aspect ratio of 20 or more, or 30, 40, 50, or 100 or more.

With the processing method, the process gas contains the $C_xH_yF_z$ gas and the HF-based gas, allowing generation of many HF species in the plasma. During the processing in step ST22, the HF species (etchant) may thus be sufficiently supplied to the bottom BT of the recess RC formed in the silicon-containing film SF. With the processing method, the process gas contains a phosphorus-containing gas. A phosphorus active species (ions and radicals) in the plasma may facilitate adsorption of the HF species (etchant) at the bottom BT of the recess RC. This may improve the etching rate of the silicon-containing film SF.

The temperature of the substrate support 14 may be controlled to a lower temperature in step ST22. The temperature of the substrate support 14 may be, for example, 20° C. or lower, or 0, −10, −20, −30, −40, or −70° C. or lower. The temperature of the substrate support 14 is adjustable by the heat exchange medium supplied by the chiller unit. The adsorption coefficient of the HF species increases more at a lower temperature. Thus, the adsorption of the HF species (etchant) at the bottom BT of the recess RC is facilitated by controlling the temperature of the substrate support 14 to a low temperature to reduce an increase in the temperature of the substrate W. This may improve the etching rate of the silicon-containing film SF.

With the processing method, the process gas contains the $C_xH_yF_z$ gas. The $C_xH_yF_z$ gas produces high-density $C_xH_yF_z$-based radicals in the plasma. As shown in FIG. 7, the $C_xH_yF_z$ radicals are adsorbed on the surface of the mask film MK (an upper surface TI and the side wall Si) to form a protective film PF. The protective film PF reduces the likelihood of the surface of the mask film MK being removed by etching (the etching rate of the mask film MK increasing) during the processing in step ST22. This improves the selectivity of the silicon-containing film SF to the mask film MK.

With the processing method, the process gas contains a phosphorus-containing gas. The phosphorus-containing gas produces a phosphorus active species in the plasma. The phosphorus active species may combine with elements in the mask film MK to form a portion of the protective film PF. For the mask film MK containing carbon, for example, the phosphorus active species may combine with carbon on the surface of the mask film MK and form a portion of the protective film PF. The binding energy between phosphorus and carbon is greater than the binding energy between carbon atoms. The protective film PF reduces the likelihood of the surface of the mask film MK being removed by etching (the etching rate of the mask film MK increasing) during the processing in step ST22. In other words, the phosphorus-containing gas in the process gas may contribute to improving the selectivity of the silicon-containing film SF.

As shown in FIG. 7, the protective film PF with $C_xH_yF_z$ radicals can also form on the side wall S2 of the silicon-containing film SF. The protective film PF may reduce the likelihood of the side wall S2 of the silicon-containing film SF being etched in the lateral direction (right-left direction in FIG. 7) during the processing in step ST22. This allows the feature, the dimensions, or both of the recess RC in the silicon-containing film SF to be maintained appropriately. This may reduce, for example, the likelihood of the width of the recess RC formed in the silicon-containing film SF being partially greater (bowing), or the recess RC being etched in the lateral direction (e.g., bending or twisting) without being etched linearly in the depth direction (top to bottom direction in FIG. 7). The protective film PF may be thinner in the depth direction of the silicon-containing film SF.

The phosphorus active species in the plasma described above may combine with elements in the silicon-containing film SF to form a portion of the protective film PF. For the silicon-containing film SF being an oxygen-containing film such as a silicon oxide film or a silicon nitride film, for example, the phosphorus active species in the plasma may combine with the oxygen in the silicon-containing film SF and form a portion of the protective film PF. The bond between phosphorus and oxygen is chemically strong, and the protective film PF containing the bond between phosphorus and oxygen is not easily removed by low-energy ions that collide with the side wall S2 of the silicon-containing film SF at a narrow angle. The protective film PF may thus reduce the likelihood of the side wall S2 of the silicon-containing film SF being etched in the lateral direction during the processing in step ST22. In other words, the phosphorus-containing gas in the process gas may contribute to appropriately maintaining the feature, the dimensions, or both of the recess RC formed in the silicon-containing film SF (e.g., reducing bowing).

In step ST22, when plasma is being generated in the internal space 10*s*, the bias power supply 64 may periodically apply a pulsed electrical bias to the substrate support 14. The periodic pulsed electrical bias may allow etching and formation of the protective film PF to proceed alternately.

The flow rate of the $C_xH_yF_z$ gas supplied into the internal space 10*s* may be varied during the processing in step ST2. For example, first etching may be performed with a reaction gas containing the $C_xH_yF_z$ gas under a first partial pressure, and then second etching may be performed with a reaction gas containing the $C_xH_yF_z$ gas under a second partial pressure. For the silicon-containing film SF being a stacked film of different materials, for example, this may allow appropriate etching of the stacked film by controlling the flow rate of the $C_xH_yF_z$ gas based on the material of the film to be etched.

The flow rate of the $C_xH_yF_z$ gas supplied into the internal space 10*s* during the processing in step ST2 may differ between the center and the periphery of the substrate W in a plan view of the substrate W. Thus, when the dimensions of the openings OP each surrounded by the side wall S1 of the mask film MK differ between the center and the periphery of the substrate W, such dimensional variations may be corrected by controlling the distribution of the flow rate of the $C_xH_yF_z$ gas.

The pressure in the chamber 10 (internal space 10*s*) and the electrical bias applied to the substrate support 14 from the bias power supply 64 may be changed during the processing in step ST2. For example, step ST2 may include a first process and a second process. In the first process, the chamber 10 is set to a first pressure, a first electrical bias is applied to the substrate support 14, and the silicon-containing film SF is etched. In the second process, the chamber 10 is set to a second pressure, a second electrical bias is applied to the substrate support 14, and the silicon-containing film SF is etched. In step ST2, the first and second processes may be repeated alternately. The first pressure may differ from the second pressure, and may be, for example, higher than the second pressure. The first electrical bias may differ from the second electrical bias. For example, the absolute value of the first electrical bias may be greater than the absolute value of the second electrical bias. The first pressure, the second pressure, the first electrical bias, and the second electrical bias may be adjusted as appropriate to etch, for example, the silicon-containing film SF anisotropically until or immediately before the recess RC reaches the underlying film UF in the first process, and also to etch the bottom of the recess RC isotropically to expand laterally in the second process.

Experiments for evaluating the processing method will now be described below. The present disclosure is not limited to the experiments below.

Experiment 1

Figure 8:
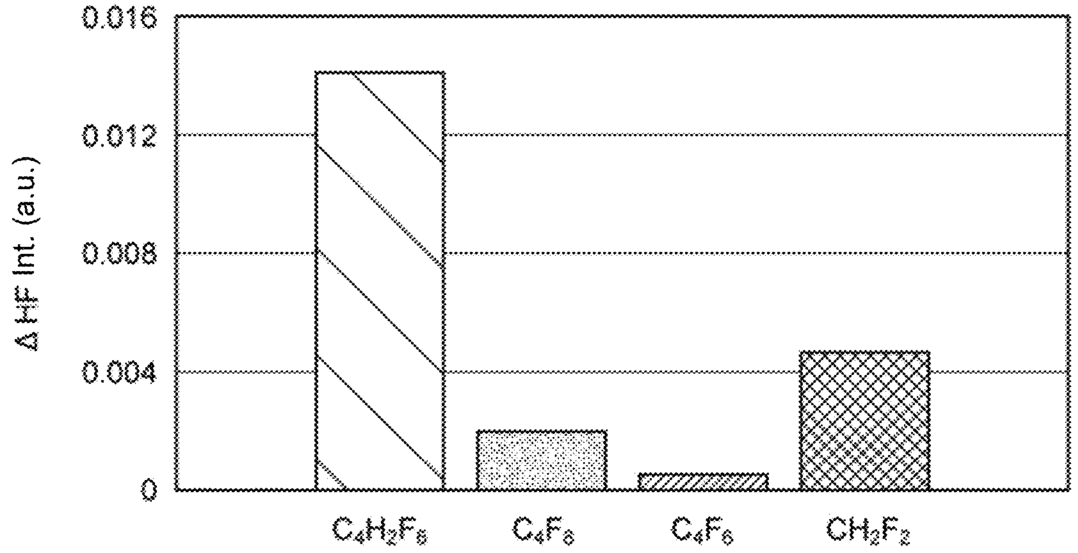
FIG. 8 is a graph showing the measurement results of Experiment 1.

FIG. 8 is a graph showing the measurement results of Experiment 1. In Experiment 1, the amount of HF species produced in various reaction gases was measured. In Experiment 1, one of a $C_4H_2F_6$ gas, a $C_4F_8$ gas, a $C_4F_6$ gas, or a $CH_2F_2$ gas and an Ar gas were supplied as a reaction gas into the internal space 10*s* of the substrate processing apparatus 1 to generate plasma for 10 minutes. The HF intensity before and after the plasma generation was then measured with a quadrupole mass analyzer. The temperature of the substrate support 14 was set at −40° C. The vertical axis in FIG. 8 indicates the difference between the HF intensity before the plasma generation and the HF intensity after the plasma generation. As the value on the vertical axis is greater, the amount of HF species produced in the plasm is greater.

As shown in FIG. 8, the $C_4H_2F_6$ gas as one example of the reaction gas for the 10 processing method produced more HF species in the plasma than the $C_4F_8$ and $C_4F_6$ gases without hydrogen elements, and also than the $CH_2F_2$ gas with hydrogen elements.

Experiment 2

Figure 9:
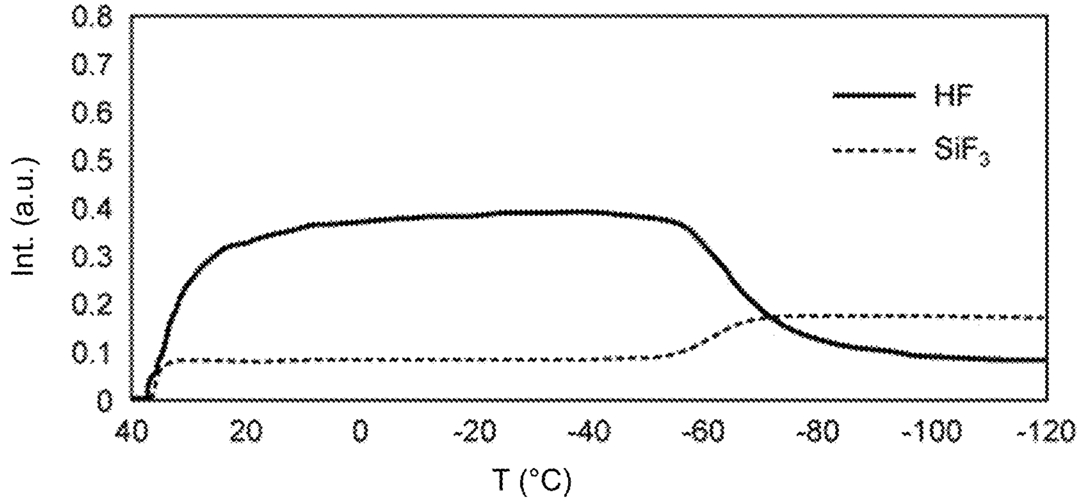
FIG. 9 is a graph showing the measurement results of Experiment 2.
Figure 10:
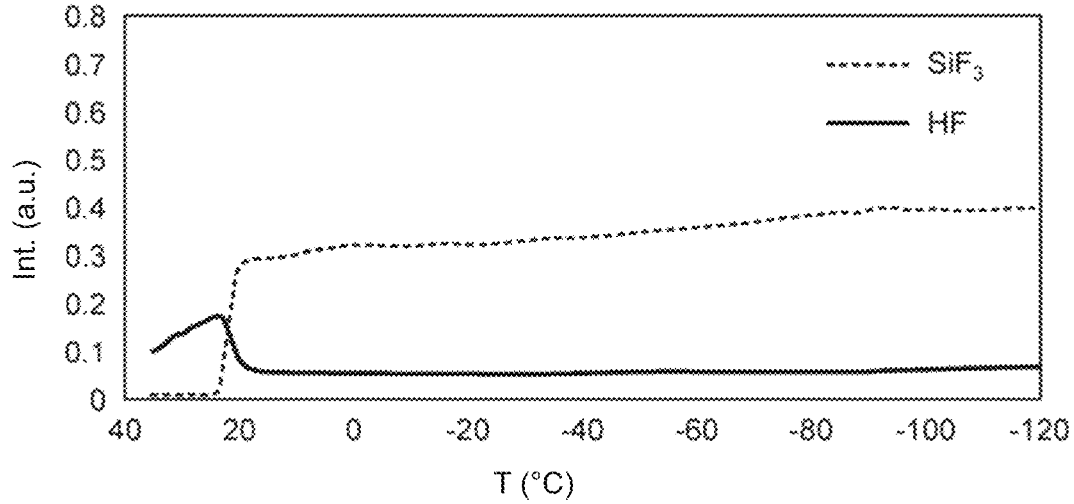
FIG. 10 is a graph showing the measurement results of Experiment 2.

FIGS. 9 and 10 are graphs showing the measurement results of Experiment 2. FIG. 9 shows the experimental results from etching a silicon oxide film by generating plasma from a process gas that is a mixture of a hydrogen fluoride gas and an argon gas using the substrate processing apparatus 1. FIG. 10 shows the experimental results from etching a silicon oxide film by generating plasma from a process gas that is a mixture of a hydrogen fluoride gas, an argon gas, and a $PF_3$ gas using the substrate processing apparatus 1. In Experiment 2, the silicon oxide film was etched while the temperature of the substrate support 14 was being changed. The amounts of HF and $SiF_3$ in the gas phase were measured using the quadrupole mass analyzer during the etching of the silicon oxide film. The horizontal axes in FIGS. 9 and 10 indicate the temperature T (° C.) of the substrate support 14. The vertical axes indicate the amounts of HF and $SiF_3$ (intensity with reference to helium).

For the process gas being a mixture of a hydrogen fluoride gas and an argon gas, the amount of HF as an etchant decreased, and the amount of $SiF_3$ as a reaction product generated by etching the silicon oxide film increased when the temperature of the substrate support 14 was at about −60° C. or lower as shown in FIG. 9. In other words, for the process gas being a mixture of a hydrogen fluoride gas and an argon gas, the amount of the etchant used in etching the silicon oxide film increased when the temperature of the substrate support 14 was at about −60° C. or lower.

As shown in FIG. 10, for the process gas being a mixture of a hydrogen fluoride gas, an argon gas, and a $PF_3$ gas, the amount of HF as an etchant decreased and the amount of $SiF_3$ as the reaction product formed by etching the silicon oxide film increased when the temperature of the substrate support 14 was at about 20° C. or lower. In other words, for the process gas further containing a $PF_3$ gas in addition to a hydrogen fluoride gas and an argon gas, the amount of the etchant used in etching the silicon oxide film increased when the temperature of the substrate support 14 was at about −20° C. or lower.

Experiment 2 reveals that the etching of the silicon oxide film proceeds to improve the selectivity of the silicon oxide film to the mask film MK as the temperature of the substrate support 14 is lower. For the process gas containing a $PF_3$ gas, or in other words, with a phosphorus active species on the surface of the silicon oxide film during etching, the adsorption of the etchant onto the silicon oxide film is facilitated to improve the etching rate although the temperature of the substrate support 14 is about 20° C. or lower.

Experiment 3

Figure 11:
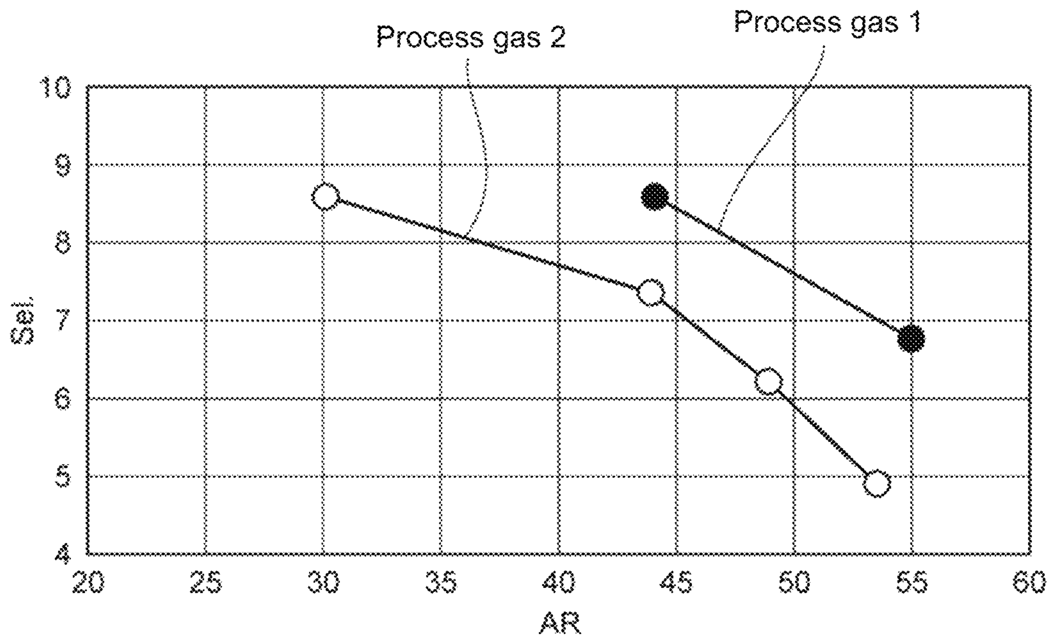
FIG. 11 is a graph showing the measurement results of Experiment 3.
Figure 12:
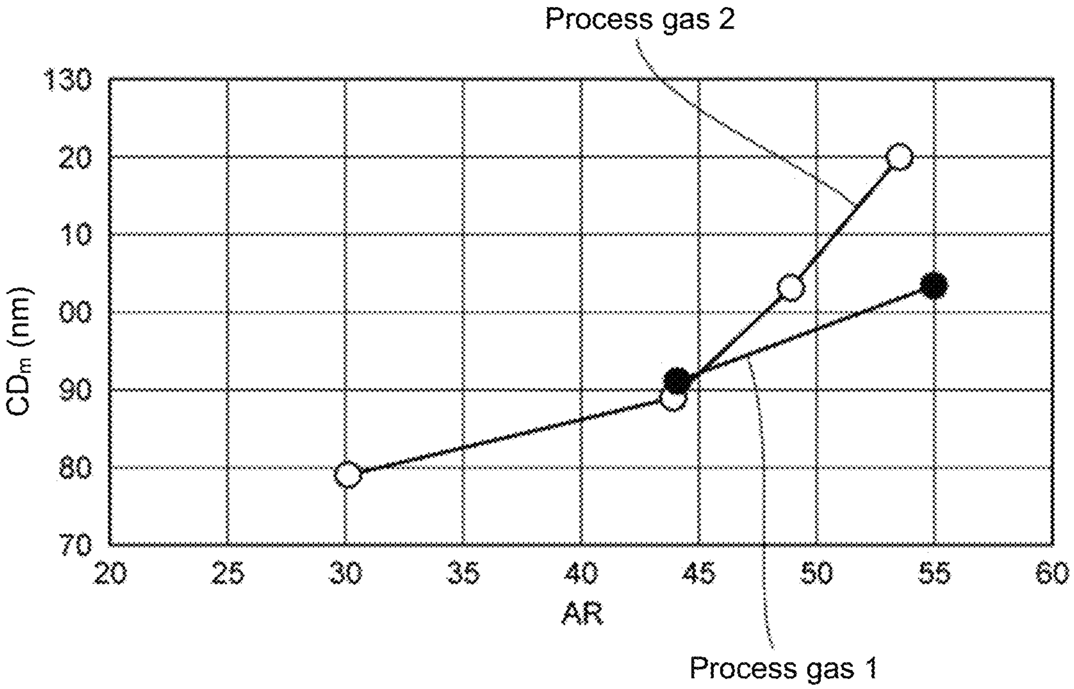
FIG. 12 is a graph showing the measurement results of Experiment 3.

FIGS. 11 and 12 are graphs showing the measurement results of Experiment 3. In Experiment 3, a sample substrate having the same structure as the substrate W was placed on the substrate support 14. A process gas was supplied into the internal space 10*s* of the substrate processing apparatus 1 to generate plasma to etch the silicon-containing film SF in the sample substrate. The temperature of the substrate support 14 was set at −40° C. A process gas 1 containing a $C_4H_2F_6$ gas, an HF gas, and a $PF_3$ gas and a process gas 2 containing a $C_4F_8$ gas and an HF gas were each used as the process gas. The process gas 1 contains a $C_4H_2F_6$ gas and the process gas 2 contains a $C_4F_8$ gas each at less than or equal to 5% by volume of the total flow of the reaction gas. The process gas 1 and the process gas 2 each contain an HF gas at greater than or equal to 90% by volume of the total flow of the reaction gas. FIG. 11 shows the relationship between the aspect ratio (AR) of the recess RC and the selectivity (Sel.) of the silicon-containing film SF to the mask film MK. The selectivity can be determined by dividing the etching rate of the silicon-containing film SF by the etching rate of the mask film MK. FIG. 12 shows the relationship between the AR of the recess RC and the maximum width of the recess RC in the silicon-containing film SF (bowing CD:$CD_m$ (nm)).

As shown in FIGS. 11 and 12, for the process gas 1 being a process gas for the processing method according to one embodiment, the high selectivity was maintained and an increase in the bowing CD was reduced compared with when the process gas 2 was used, although the aspect ratio of the recess RC formed in the silicon-containing film SF was increased.

Experiment 4

Figure 13:
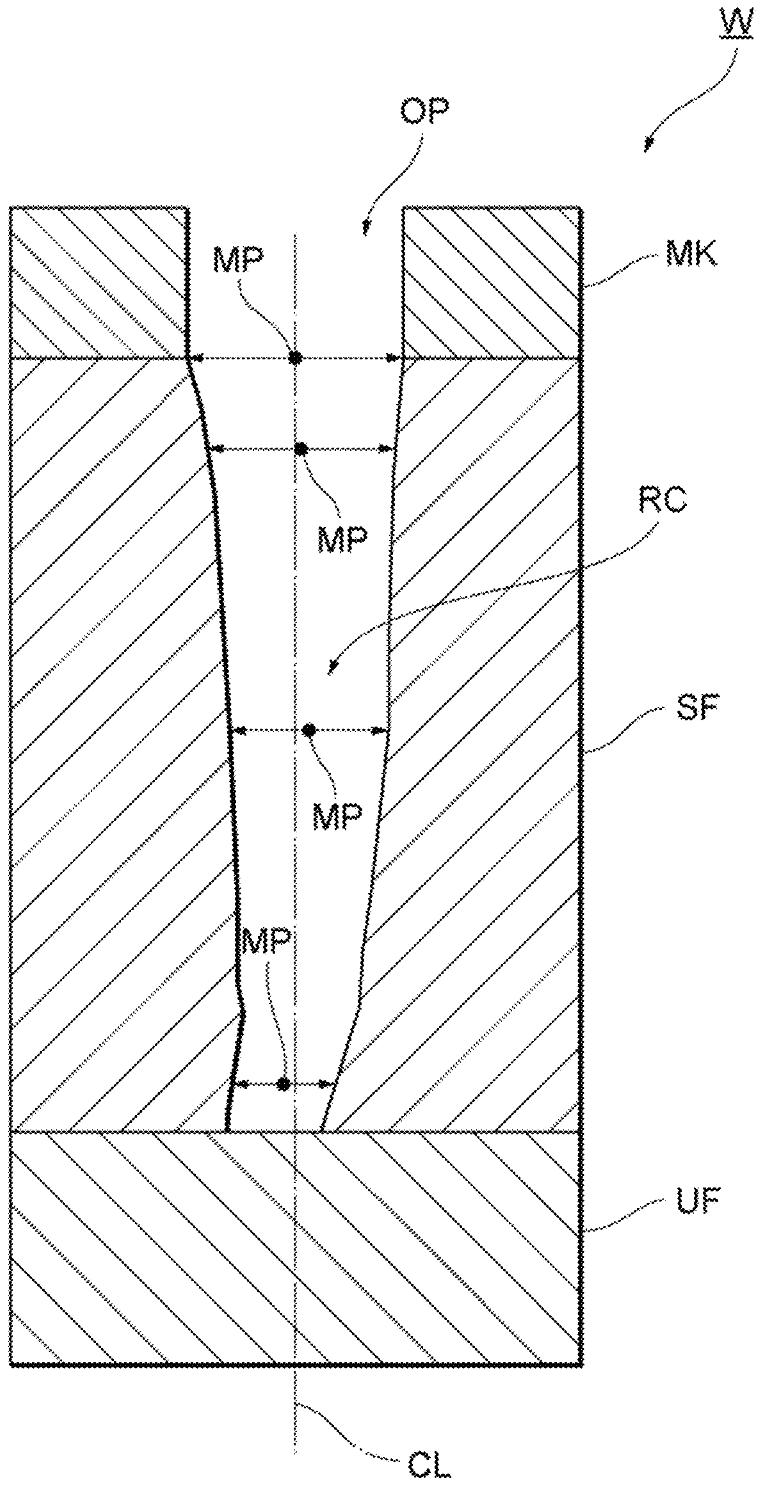
FIG. 13 is a diagram describing an example method for evaluating the cross-sectional feature of a recess RC.

FIG. 13 is a diagram describing an example method for evaluating the cross-sectional feature of the recess RC. In FIG. 13, a central reference line CL is a line passing through a midpoint MP of the width of the recess RC on the lower surface of the mask film MK or the upper surface of the silicon-containing film SF. The misalignment amount of the midpoint MP from the central reference line CL is measured in the depth direction of the recess RC to evaluate the feature of the recess RC. For example, the misalignment amount can be used to evaluate bending or twisting of the recess RC formed in the silicon-containing film SF.

Figure 14:
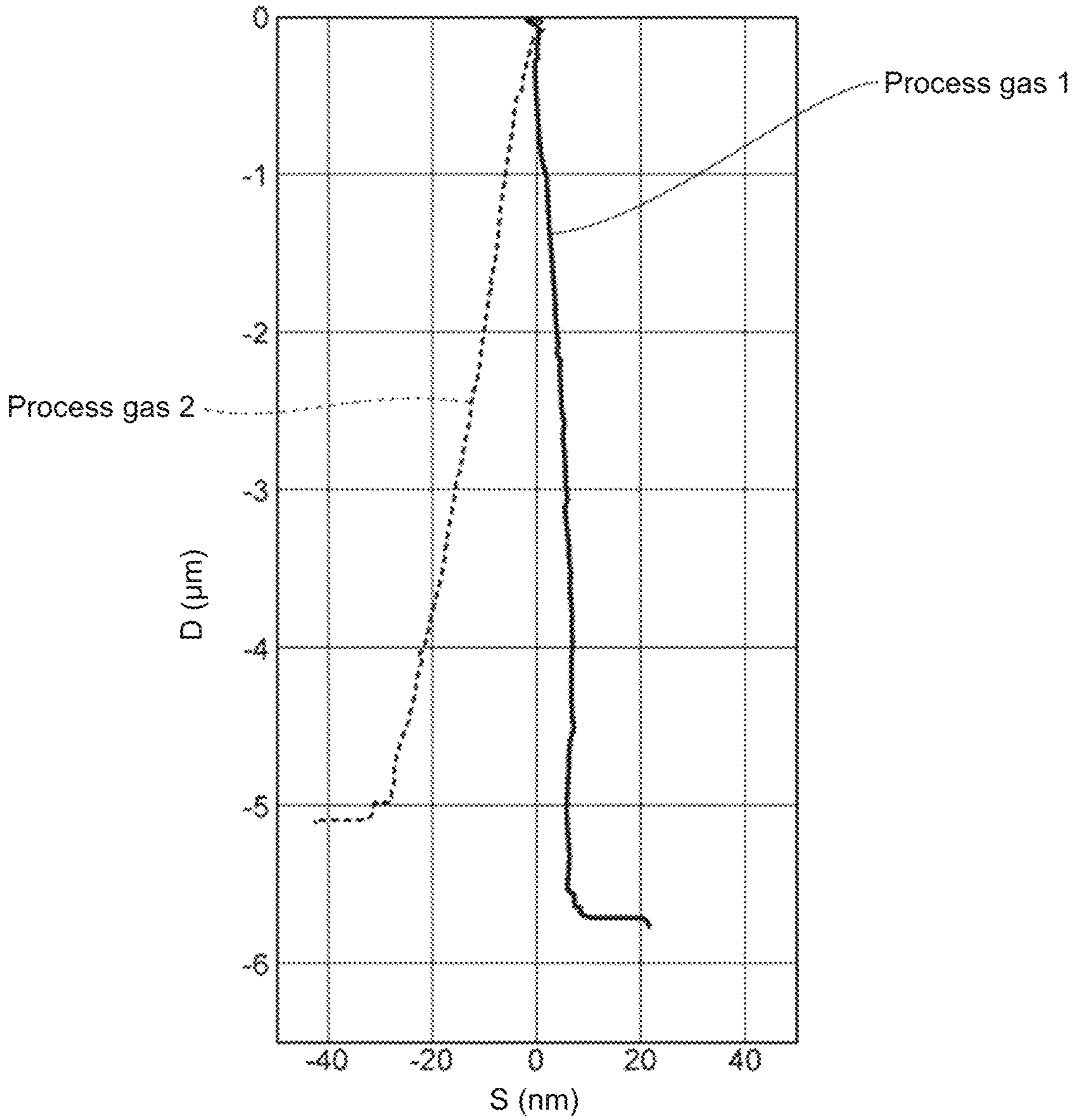
FIG. 14 is a graph showing the measurement results of Experiment 4.
Figure 15:
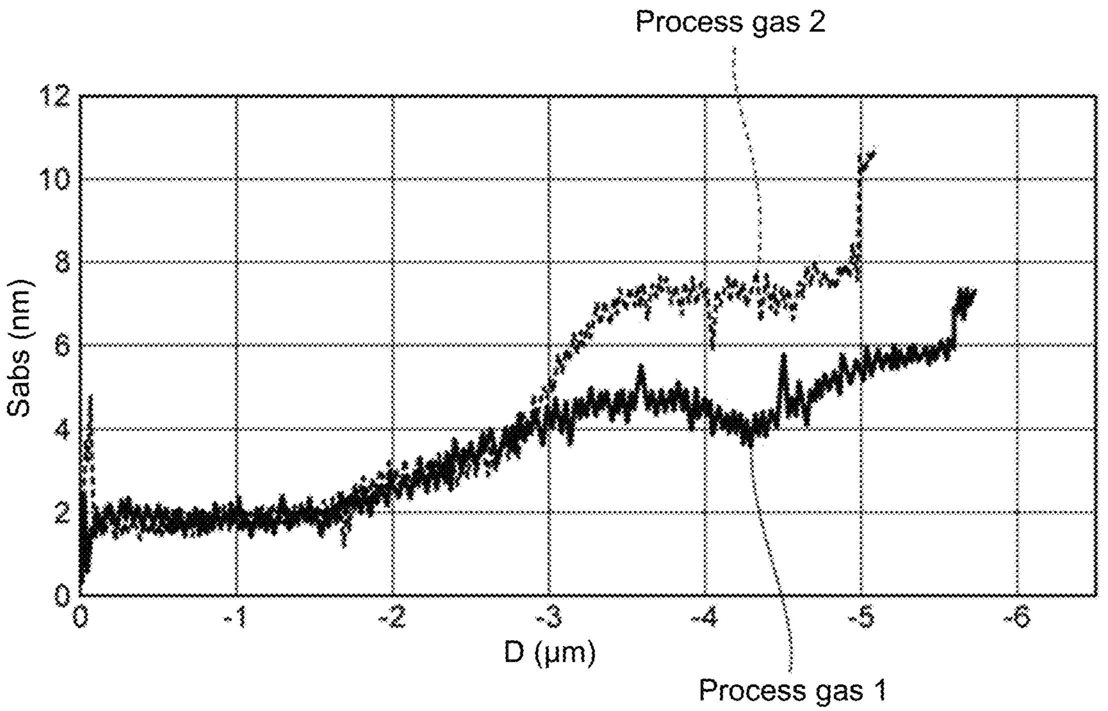
FIG. 15 is a graph showing the measurement results of Experiment 4.

FIGS. 14 and 15 are graphs showing the measurement results of Experiment 4. In Experiment 4, a sample substrate having the same structure as the substrate W was placed on the substrate support 14. A process gas was supplied into the internal space 10*s* of the substrate processing apparatus 1 to generate plasma to etch the silicon-containing film SF in the sample substrate. The temperature of the substrate support 14 was set at −40° C. The process gas 1 and the process gas 2 were used as in Experiment 3. After etching, the features of the five recesses RC formed in the silicon-containing film SF were compared for the process gas 1 and for the process gas 2.

In FIG. 14, the vertical axis indicates the depth D (μm) of the recess RC formed in the silicon-containing film SF. A depth of zero indicates the boundary between the silicon-containing film SF and the mask film MK. The horizontal axis indicates the average misalignment amount S (nm). The average misalignment amount S is the average of the misalignment amounts measured at the midpoint MP from the central reference line CL described with reference to FIG. 13 in the depth direction for each of the five recesses RC. As shown in FIG. 14, the average misalignment amount S was small over the entire depth direction when the process gas 1 is used with the processing method according to one embodiment. When the process gas 2 was used, the average misalignment amount S increased as the depth of the recess RC increased.

The misalignment amount of each recess RC described above can be either positive or negative, depending on the bending direction of the recess RC. Thus, although the absolute value of the misalignment amount of each recess RC is large, the average misalignment amount S can be small when the misalignment amount varies in the bending direction of each recess RC. As shown in FIG. 15, the mean (variance) of the absolute values of the misalignment amounts of the recesses RC was also evaluated. In FIG. 15, the vertical axis indicates the dispersion Sabs (nm) of the above five recesses RC. The dispersion Sabs is the average of the absolute values of misalignment amounts for the recesses RC. The horizontal axis indicates the depth D (μm) of the recess RC formed in the silicon-containing film SF. A depth of zero indicates the boundary between the silicon-containing film SF and the mask film MK. As shown in FIG. 15, an increase in the dispersion Sabs (nm) was reduced with the process gas 1 despite the increase in the depth, compared with when the process gas 2 was used. Thus, the average misalignment amount S was small in the entire depth direction in FIG. 14 when the process gas 1 was used. This may result from the small misalignment amount for each recess RC, rather than positive or negative variations in the bending direction of each recess RC, as shown in FIG. 15.

Experiment 4 reveals less bending or twisting of the recess RC for etching to proceed further in the vertical direction when the process gas 1 was used with the processing method according to one embodiment as compared with when the process gas 2 was used.

The above embodiments further include the aspects described below.

APPENDIX 1

An etching gas composition, comprising:

an HF gas:

a phosphorus halide gas: and at least one gas selected from the group consisting of a $C_4H_2F_6$ gas, a $C_4H_2F_8$ gas, a $C_3H_2F_4$ gas, and a $C_3H_2F_6$ gas.

APPENDIX 2

The etching gas composition according to appendix 1, wherein the phosphorus halide gas contains at least one selected from the group consisting of a $PF_3$ gas, a $PF_5$ gas, a $POF_3$ gas, an $HPF_6$ gas, a $PCl_3$ gas, a PCIs gas, a $POCl_3$ gas, a $PBr_3$ gas, a $PBr_5$ gas, a $POBr_3$ gas, and a $PI_3$ gas.

APPENDIX 3

The etching gas composition according to appendix 1 or appendix 2, further comprising:

at least one selected from the group consisting of a halogen-containing gas, a carbon-containing gas, an oxygen-containing gas, and a nitrogen-containing gas.

APPENDIX 4

The etching gas composition according to appendix 3, wherein the halogen-containing gas is at least one selected from the group consisting of a chlorine-containing gas, a bromine-containing gas, and an iodine-containing gas.

APPENDIX 5

The etching gas composition according to appendix 3, wherein the halogen-containing gas is at least one gas selected from the group consisting of $Cl_2$, $SiCl_2$, $SiCl_4$, $CCl_4$, $SiH_2Cl_2$, $Si_2Cl_6$, $CHCl_3$, $SO_2Cl_2$, $BCl_3$, $PCl_3$, $PCl_5$, $POCl_3$, $Br_2$, HBr, $CBr_2F_2$, $C_2F_5Br$, $PBr_3$, $PBr_5$, $POBr_3$, $BBr_3$, HI, $CF_3I$, $C_2F_5I$, $C_3F_7I$, $IF_5$, $IF_7$, $I_2$, and $PI_3$.

APPENDIX 6

The etching gas composition according to any one of appendixes 3 to 5, wherein the carbon-containing gas is at least one selected from the group consisting of a $C_aH_b$ gas, a $C_cF_d$ gas, and a $CH_eF_f$ gas, where a and b are integers greater than or equal to 1, c and d are integers greater than or equal to 1, and e and f are integers greater than or equal to 1.

APPENDIX 7

The etching gas composition according to any one of appendixes 3 to 6, wherein the nitrogen-containing gas is at least one selected from the group consisting of an $NF_3$ gas, an $N_2$ gas, and an $NH_3$ gas.

APPENDIX 8

The etching gas composition according to any one of appendixes 1 to 6, further comprising:

an oxygen-containing gas, wherein the oxygen-containing gas is at least one selected from the group consisting of an $O_2$ gas, a CO gas, a $CO_2$ gas, an $H_2O$ gas, and an $H_2O_2$ gas.

APPENDIX 9

The etching gas composition according to any one of appendixes 1 to 8, further comprising:

at least one selected from the group consisting of a boron-containing gas and a sulfur-containing gas.

APPENDIX 10

The etching gas composition according to any one of appendixes 1 to 9, further comprising:

an inert gas.

The processing method may be modified in various ways without departing from the spirit and scope of the present disclosure. For example, the processing method may be performed with, in addition to the substrate processing apparatus 1 using capacitively coupled plasma, a substrate processing apparatus using any plasma source for, for example, inductively coupled plasma or microwave plasma.

REFERENCE SIGNS LIST

1 Substrate processing apparatus
10 Chamber
**10*s*** Internal space
12 Chamber body
14 Substrate support
16 Electrode plate
18 Lower electrode
20 Electrostatic chuck (ESC)
30 Upper electrode
50 Exhaust device
62 Radio frequency (RF) power supply
64 Bias power supply
80 Controller
CT Controller
SF Silicon-containing film
MK Mask film
OP Opening
PF Protective film
RC Recess
UF Underlying film
W Substrate

The invention claimed is:

1. A substrate processing method, comprising:

providing a substrate with a silicon-containing film in a chamber;

supplying a process gas containing an HF gas, a phosphorus halide gas, and at least one gas selected from the group consisting of a $C_4H_2F_6$ gas, a $C_4H_2F_8$ gas, and a $C_3H_2F_6$ gas into the chamber to generate plasma; and etching the silicon-containing film in the substrate with the plasma.

2. The substrate processing method according to claim 1, wherein the phosphorus halide gas contains at least one selected from the group consisting of a $PF_3$ gas, a $PF_5$ gas, a $POF_3$ gas, an $HPF_6$ gas, a $PCl_3$ gas, a $PCl_5$ gas, a $POCl_3$ gas, a $PBr_3$ gas, a $PBr_5$ gas, a $POBr_3$ gas, and a $PI_3$ gas.

3. The substrate processing method according to claim 1, wherein the process gas further contains at least one gas selected from the group consisting of a halogen-containing gas, a carbon-containing gas, an oxygen-containing gas, and a nitrogen-containing gas.

4. The substrate processing method according to claim 1, wherein the process gas contains at least one halogen-containing gas selected from the group consisting of a chlorine-containing gas, a bromine-containing gas, and an iodine-containing gas.

5. The substrate processing method according to claim 1, wherein the process gas contains at least one halogen-containing gas selected from the group consisting of $Cl_2$, $SiCl_2$, $SiCl_4$, $CCl_4$, $SiH_2Cl_2$, $Si_2Cl_6$, $CHCl_3$, $SO_2Cl_2$, $BCl_3$, $PCl_3$, $PCl_5$, $POCl_3$, $Br_2$, HBr, $CBr_2F_2$, $C_2F_5Br$, $PBr_3$, $PBr_3$, $POBr_3$, $BBr_3$, HI, $CF_3I$, $C_2F_5I$, $C_3F_7I$, $IF_5$, $IF_7$, $I_2$, and $PI_3$.

6. The substrate processing method according to claim 1, wherein the process gas contains at least one carbon-containing gas selected from the group consisting of a $C_aH_b$ gas, a $C_cF_d$ gas, and a $CH_eF_f$ gas, where a and b are integers greater than or equal to 1, c and d are integers greater than or equal to 1, and e and f are integers greater than or equal to 1.

7. The substrate processing method according to claim 1, wherein the process gas contains at least one nitrogen-containing gas selected from the group consisting of an $NF_3$ gas, an $N_2$ gas, and an $NH_3$ gas.

8. The substrate processing method according to claim 1, wherein the process gas further contains an oxygen-containing gas, and the oxygen-containing gas is at least one gas selected from the group consisting of an $O_2$ gas, a CO gas, a $CO_2$ gas, an $H_2O$ gas, and an $H_2O_2$ gas.

9. The substrate processing method according to claim 1, wherein the process gas further contains at least one gas selected from the group consisting of a boron-containing gas and a sulfur-containing gas.

10. The substrate processing method according to claim 1, wherein the process gas further contains an inert gas.

11. The substrate processing method according to claim 1, wherein the silicon-containing film includes at least one film selected from the group consisting of a silicon oxide film, a silicon nitride film, and a polysilicon film.

12. The substrate processing method according to claim 1, wherein the substrate includes a mask including an organic film or a metal-containing film, and the organic film or the metal-containing film defines at least one opening in the silicon-containing film.

13. The substrate processing method according to claim 1, wherein the etching includes applying an electrical bias to a substrate support during a first period and a second period that alternates with the first period, and the electrical bias in the first period is zero or at a first level, and the electrical bias in the second period is at a second level higher than the first level.

14. The substrate processing method according to claim 13, wherein the etching includes providing radio frequency power, to generate plasma, to the substrate support or an upper electrode facing the substrate support during a third period and a fourth period that alternates with the third period, the radio frequency power in the third period is zero or at a third level, and the radio-frequency power in the fourth period is at a fourth level higher than the third level, and the second period and the fourth period at least partially overlap.

15. The substrate processing method according to claim 13, wherein the electrical bias is a pulsed voltage.

16. The substrate processing method according to claim 1, wherein the etching includes providing a direct-current voltage or low-frequency power to an upper electrode facing a substrate support.

17. The substrate processing method according to claim 1, wherein the etching includes a first process of setting the chamber to a first pressure, applying a first electrical bias to a substrate support, and etching the silicon-containing film, and a second process of setting the chamber to a second pressure, applying a second electrical bias to the substrate support, and etching the silicon-containing film, and the first pressure differs from the second pressure or the first electrical bias differs from the second electrical bias, or the first pressure differs from the second pressure and the first electrical bias differs from the second electrical bias.

18. The substrate processing method according to claim 17, wherein the first pressure is higher than the second pressure.

19. The substrate processing method according to claim 17, wherein an absolute value of the first electrical bias is greater than an absolute value of the second electrical bias.

20. The substrate processing method according to claim 17, wherein the first process and the second process are repeated alternately.

21. A substrate processing method, comprising:

providing a substrate with a silicon-containing film in a chamber;

supplying a process gas containing a $C_xH_yF_z$ gas, a fluorine-containing gas, and a phosphorus-containing gas into the chamber to generate plasma, where x is an integer greater than or equal to 2, 4 or 5, and y and z are integers greater than or equal to 1, wherein when x is 3 and z is 6; and etching the silicon-containing film in the substrate with the plasma.

22. The substrate processing method according to claim 21, wherein the fluorine-containing gas is a gas to produce an HF species in the chamber.

23. The substrate processing method according to claim 21, wherein the $C_xH_yF_z$ gas includes one or more $CF_3$ groups.

24. The substrate processing method according to claim 21, wherein the $C_xH_yF_z$ gas contains at least one selected from the group consisting of a $C_3H_2F_6$ gas, a $C_4H_2F_6$ gas, a $C_4H_2F_8$ gas, and a $C_5H_2F_6$ gas.

25. The substrate processing method according to claim 21, wherein the phosphorus-containing gas contains at least one selected from the group consisting of a $PF_3$ gas, a $PF_5$ gas, a $POF_3$ gas, an $HPF_6$ gas, a $PCl_3$ gas, a $PCl_5$ gas, a $POCl_3$ gas, a $PBr_3$ gas, a $PBr_5$ gas, a $POBr_3$ gas, a $PI_3$ gas, a $P_4O_{10}$ gas, a $P_4O_8$ gas, a $P_4O_6$ gas, a $PH_3$ gas, a $Ca_3P_2$ gas, an $H_3PO_4$ gas, and an $Na_3PO_4$ gas.

26. A substrate processing method, comprising:

placing a substrate with a silicon-containing film on a substrate support in a chamber;

generating plasma in the chamber; and etching the silicon-containing film using an HF species and a $C_xH_yF_z$ species in the plasma, where x is an integer greater than or equal to 2, and y and z are integers greater than or equal to 1, wherein when x is 3 and z is 6, wherein the plasma includes an active species of phosphorus and wherein the HF species has a highest flow rate as a percentage of total flow rate of reaction gases.

* * * * *